US008654868B2

(12) United States Patent
Jacobs et al.

(10) Patent No.: US 8,654,868 B2
(45) Date of Patent: *Feb. 18, 2014

(54) OFFLOADED PROCESSING FOR WIRELESS APPLICATIONS

(75) Inventors: Paul E. Jacobs, La Jolla, CA (US); Chong U. Lee, San Diego, CA (US); David Jonathan Julian, San Diego, CA (US); Kamran Moallemi, Del Mar, CA (US); Manuel E. Jaime, Solana Beach, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1044 days.

This patent is subject to a terminal disclaimer.

(21) Appl. No.: 11/736,481

(22) Filed: Apr. 17, 2007

(65) Prior Publication Data
US 2008/0043824 A1  Feb. 21, 2008

(51) Int. Cl.
*H04L 27/00*  (2006.01)
*G06F 15/16*  (2006.01)

(52) U.S. Cl.
USPC ........................................... 375/259; 709/201

(58) Field of Classification Search
USPC ......... 375/242, 254, 259, 285, 295, 316, 346, 375/229; 381/1, 13, 23, 312, 315, 317, 381/71.1, 71.7, 94.1, 150; 340/500, 538.11, 340/538.12, 540, 573.1, 531, 539.1, 539.11, 340/539.12; 709/201
See application file for complete search history.

(56) References Cited

U.S. PATENT DOCUMENTS

| 4,796,004 | A | * | 1/1989 | Rich et al. ............... 341/143 |
| 5,196,825 | A | | 3/1993 | Young |
| 5,225,842 | A | | 7/1993 | Brown et al. |
| 5,298,904 | A | | 3/1994 | Olich |
| 5,406,284 | A | | 4/1995 | Lin et al. |

(Continued)

FOREIGN PATENT DOCUMENTS

| CN | 1647458 A | 7/2005 |
| CN | 1722785 A | 1/2006 |

(Continued)

OTHER PUBLICATIONS

Chiasserini, C.F. et al., "On the concept of 1-17 distributed digital signal processing in wireless sensor networks," Military Communications Conference. Milcom 2002, Anaheim, CA, vol. 1, Oct. 7, 2002, pp. 260-264.

(Continued)

*Primary Examiner* — Emmanuel Bayard
*Assistant Examiner* — Vineeta Panwalkar
(74) *Attorney, Agent, or Firm* — Paul S. Holdaway

(57) ABSTRACT

Processing may be performed by a first device on behalf of a second device to offload processing from the second device. In some aspects a device from which processing has been offloaded may be advantageously adapted to consume less power, have a smaller size, and have less complexity. Offloaded processing may be employed to enable a first device to process data for transmission and then send the data to another device for processing. Offloaded processing may be employed to enable a first device to process data on behalf of a second device and then send the processed data to the second device. In some aspects the data may be waveform encoded for wireless transmission between the devices. Offloaded processing may be implemented in a static manner or in a dynamic manner.

149 Claims, 15 Drawing Sheets

(56) References Cited

U.S. PATENT DOCUMENTS

| | | |
|---|---|---|
| 5,479,522 A * | 12/1995 | Lindemann et al. ......... 381/23.1 |
| 5,617,058 A | 4/1997 | Adrian et al. |
| 5,687,169 A | 11/1997 | Fullerton |
| 5,742,772 A * | 4/1998 | Sreenan ..................... 709/226 |
| 5,764,696 A | 6/1998 | Barnes et al. |
| 5,812,081 A | 9/1998 | Fullerton |
| 5,832,035 A | 11/1998 | Fullerton |
| 5,907,427 A | 5/1999 | Scalora et al. |
| 5,933,582 A | 8/1999 | Yamada |
| 5,952,956 A | 9/1999 | Fullerton |
| 5,956,681 A | 9/1999 | Yamakita |
| 5,956,683 A | 9/1999 | Jacbos et al. |
| 5,960,031 A | 9/1999 | Fullerton et al. |
| 5,963,581 A | 10/1999 | Fullerton et al. |
| 5,969,663 A | 10/1999 | Fullerton et al. |
| 5,995,534 A | 11/1999 | Fullerton et al. |
| 6,028,853 A | 2/2000 | Haartsen |
| 6,031,862 A | 2/2000 | Fullerton et al. |
| 6,091,374 A | 7/2000 | Barnes |
| 6,111,536 A | 8/2000 | Richards et al. |
| 6,111,538 A | 8/2000 | Schuchman et al. |
| 6,133,876 A | 10/2000 | Fullerton et al. |
| 6,141,705 A * | 10/2000 | Anand et al. ..................... 710/15 |
| 6,177,903 B1 | 1/2001 | Fullerton et al. |
| 6,178,323 B1 | 1/2001 | Nagata |
| 6,218,979 B1 | 4/2001 | Barnes et al. |
| 6,295,019 B1 | 9/2001 | Richards et al. |
| 6,297,737 B1 | 10/2001 | Irvin |
| 6,297,773 B1 | 10/2001 | Fullerton et al. |
| 6,300,903 B1 | 10/2001 | Richards et al. |
| 6,304,623 B1 | 10/2001 | Richards et al. |
| 6,351,652 B1 | 2/2002 | Finn et al. |
| 6,354,946 B1 | 3/2002 | Finn |
| 6,370,599 B1 | 4/2002 | Anand et al. |
| 6,400,307 B2 | 6/2002 | Fullerton et al. |
| 6,400,329 B1 | 6/2002 | Barnes |
| 6,421,389 B1 | 7/2002 | Jett et al. |
| 6,430,208 B1 | 8/2002 | Fullerton et al. |
| 6,437,756 B1 | 8/2002 | Schantz |
| 6,462,701 B1 | 10/2002 | Finn |
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Fullerton et al. |
| 6,492,904 B2 | 12/2002 | Richards |
| 6,492,906 B1 | 12/2002 | Richards et al. |
| 6,501,393 B1 | 12/2002 | Richards et al. |
| 6,504,483 B1 | 1/2003 | Richards et al. |
| 6,512,455 B2 | 1/2003 | Finn et al. |
| 6,512,488 B2 | 1/2003 | Schantz |
| 6,515,588 B1 | 2/2003 | Sarabia |
| 6,519,464 B1 | 2/2003 | Santhoff et al. |
| 6,529,568 B1 | 3/2003 | Richards et al. |
| 6,538,615 B1 | 3/2003 | Schantz |
| 6,539,213 B1 | 3/2003 | Richards et al. |
| 6,549,567 B1 | 4/2003 | Fullerton |
| 6,552,677 B2 | 4/2003 | Barnes et al. |
| 6,556,621 B1 | 4/2003 | Richards et al. |
| 6,560,463 B1 | 5/2003 | Santhoff |
| 6,571,089 B1 | 5/2003 | Richards et al. |
| 6,573,857 B2 | 6/2003 | Fullerton et al. |
| 6,577,691 B2 | 6/2003 | Richards et al. |
| 6,585,597 B2 | 7/2003 | Finn |
| 6,593,886 B2 | 7/2003 | Schantz |
| 6,594,628 B1 | 7/2003 | Jacobs et al. |
| 6,606,051 B1 | 8/2003 | Fullerton et al. |
| 6,611,234 B2 | 8/2003 | Fullerton et al. |
| 6,614,384 B2 | 9/2003 | Hall et al. |
| 6,621,462 B2 | 9/2003 | Barnes |
| 6,636,566 B1 | 10/2003 | Roberts et al. |
| 6,636,567 B1 | 10/2003 | Roberts et al. |
| 6,636,573 B2 | 10/2003 | Richards et al. |
| 6,642,903 B2 | 11/2003 | Schantz |
| 6,661,342 B2 | 12/2003 | Hall et al. |
| 6,667,724 B2 | 12/2003 | Barnes et al. |
| 6,670,909 B2 | 12/2003 | Kim |
| 6,671,310 B1 | 12/2003 | Richards et al. |
| 6,674,396 B2 | 1/2004 | Richards et al. |
| 6,677,796 B2 | 1/2004 | Brethour et al. |
| 6,693,571 B2 | 2/2004 | Melanson et al. |
| 6,700,538 B1 | 3/2004 | Richards |
| 6,710,736 B2 | 3/2004 | Fullerton et al. |
| 6,717,992 B2 | 4/2004 | Cowie et al. |
| 6,748,040 B1 | 6/2004 | Johnson et al. |
| 6,750,757 B1 | 6/2004 | Gabig, Jr. et al. |
| 6,759,948 B2 | 7/2004 | Grisham et al. |
| 6,760,387 B2 | 7/2004 | Langford et al. |
| 6,762,678 B2 | 7/2004 | Arens |
| 6,762,712 B2 | 7/2004 | Kim |
| 6,763,057 B1 | 7/2004 | Fullerton et al. |
| 6,763,282 B2 | 7/2004 | Glenn et al. |
| 6,774,846 B2 | 8/2004 | Fullerton et al. |
| 6,774,859 B2 | 8/2004 | Schantz et al. |
| 6,778,603 B1 | 8/2004 | Fullerton et al. |
| 6,781,530 B2 | 8/2004 | Moore |
| 6,782,048 B2 | 8/2004 | Santhoff |
| 6,788,730 B1 | 9/2004 | Richards et al. |
| 6,822,604 B2 | 11/2004 | Hall et al. |
| 6,823,022 B1 | 11/2004 | Fullerton et al. |
| 6,831,508 B2 | 12/2004 | Shima |
| 6,836,223 B2 | 12/2004 | Moore |
| 6,836,226 B2 | 12/2004 | Moore |
| 6,845,253 B1 | 1/2005 | Schantz |
| 6,847,675 B2 | 1/2005 | Fullerton et al. |
| 6,868,073 B1 | 3/2005 | Carrender |
| 6,879,878 B2 | 4/2005 | Glenn et al. |
| 6,882,301 B2 | 4/2005 | Fullerton |
| 6,895,034 B2 | 5/2005 | Nunally et al. |
| 6,898,414 B2 | 5/2005 | Ekl et al. |
| 6,900,732 B2 | 5/2005 | Richards |
| 6,906,625 B1 | 6/2005 | Taylor et al. |
| 6,907,244 B2 | 6/2005 | Santhoff et al. |
| 6,912,240 B2 | 6/2005 | Kumar et al. |
| 6,914,949 B2 | 7/2005 | Richards et al. |
| 6,917,284 B2 | 7/2005 | Grisham et al. |
| 6,919,838 B2 | 7/2005 | Santhoff |
| 6,922,166 B2 | 7/2005 | Richards et al. |
| 6,922,177 B2 | 7/2005 | Barnes et al. |
| 6,924,700 B2 | 8/2005 | Taura et al. |
| 6,925,109 B2 | 8/2005 | Richards et al. |
| 6,933,882 B2 | 8/2005 | Fullerton |
| 6,937,639 B2 | 8/2005 | Pendergrass et al. |
| 6,937,663 B2 | 8/2005 | Jett et al. |
| 6,937,667 B1 | 8/2005 | Fullerton et al. |
| 6,937,674 B2 | 8/2005 | Santhoff et al. |
| 6,947,492 B2 | 9/2005 | Santhoff et al. |
| 6,950,485 B2 | 9/2005 | Richards et al. |
| 6,954,480 B2 | 10/2005 | Richards et al. |
| 6,959,031 B2 | 10/2005 | Haynes et al. |
| 6,959,032 B1 | 10/2005 | Richards et al. |
| 6,963,727 B2 | 11/2005 | Shreve |
| 6,980,613 B2 | 12/2005 | Krivokapic |
| 6,989,751 B2 | 1/2006 | Richards |
| 7,015,793 B2 | 3/2006 | Gabig, Jr. et al. |
| 7,020,224 B2 | 3/2006 | Krivokapic |
| 7,020,701 B1 | 3/2006 | Gelvin |
| 7,027,425 B1 | 4/2006 | Fullerton et al. |
| 7,027,483 B2 | 4/2006 | Santhoff et al. |
| 7,027,493 B2 | 4/2006 | Richards |
| 7,030,806 B2 | 4/2006 | Fullerton |
| 7,034,609 B2 | 4/2006 | Risbo et al. |
| 7,042,417 B2 | 5/2006 | Santhoff et al. |
| 7,046,187 B2 | 5/2006 | Fullerton et al. |
| 7,046,618 B2 | 5/2006 | Santhoff et al. |
| 7,057,456 B2 | 6/2006 | Taura et al. |
| 7,069,111 B2 | 6/2006 | Glenn et al. |
| 7,075,476 B2 | 7/2006 | Kim |
| 7,079,827 B2 | 7/2006 | Richards et al. |
| 7,099,367 B2 | 8/2006 | Richards et al. |
| 7,099,368 B2 | 8/2006 | Santhoff et al. |
| 7,129,886 B2 | 10/2006 | Hall et al. |
| 7,132,975 B2 | 11/2006 | Fullerton et al. |
| 7,145,954 B1 | 12/2006 | Pendergrass et al. |
| 7,148,791 B2 | 12/2006 | Grisham et al. |

(56) References Cited

U.S. PATENT DOCUMENTS

| | | | |
|---|---|---|---|
| 7,151,490 B2 | 12/2006 | Richards | |
| 7,167,525 B2 | 1/2007 | Santhoff et al. | |
| 7,170,408 B2 | 1/2007 | Taylor et al. | |
| 7,184,938 B1 | 2/2007 | Lansford et al. | |
| 7,190,722 B2 | 3/2007 | Lakkis et al. | |
| 7,190,729 B2 | 3/2007 | Siwiak | |
| 7,206,334 B2 | 4/2007 | Siwiak | |
| 7,206,423 B1* | 4/2007 | Feng et al. | 381/312 |
| 7,209,724 B2 | 4/2007 | Richards et al. | |
| 7,230,980 B2 | 6/2007 | Langford et al. | |
| 7,239,277 B2 | 7/2007 | Fullerton et al. | |
| RE39,759 E | 8/2007 | Fullerton | |
| 7,256,727 B2 | 8/2007 | Fullerton et al. | |
| 7,271,779 B2 | 9/2007 | Hertel | |
| 7,279,965 B2 | 10/2007 | Hansen et al. | |
| 7,286,009 B2 | 10/2007 | Andersen et al. | |
| 7,324,479 B2 | 1/2008 | Hur | |
| 7,348,840 B2 | 3/2008 | Magrath et al. | |
| 7,388,886 B2 | 6/2008 | Perkins et al. | |
| 7,576,605 B2 | 8/2009 | Lee et al. | |
| 2001/0049471 A1 | 12/2001 | Suzuki et al. | |
| 2002/0100061 A1 | 7/2002 | Tsusaka et al. | |
| 2002/0109501 A1 | 8/2002 | Schroeder | |
| 2003/0002698 A1* | 1/2003 | Ludvigsen | 381/314 |
| 2003/0078065 A1* | 4/2003 | Hoagland et al. | 455/517 |
| 2003/0125090 A1 | 7/2003 | Zeira | |
| 2003/0227984 A1 | 12/2003 | Batra et al. | |
| 2004/0001588 A1 | 1/2004 | Hairston | |
| 2004/0032363 A1 | 2/2004 | Schantz et al. | |
| 2004/0062325 A1* | 4/2004 | England et al. | 375/340 |
| 2004/0128382 A1 | 7/2004 | Shimoda et al. | |
| 2004/0164902 A1 | 8/2004 | Karlsson et al. | |
| 2004/0202339 A1* | 10/2004 | O'Brien et al. | 381/312 |
| 2004/0203797 A1 | 10/2004 | Burr | |
| 2004/0207465 A1 | 10/2004 | Nilsson | |
| 2004/0242250 A1 | 12/2004 | Sasai et al. | |
| 2004/0247023 A1 | 12/2004 | Sasai et al. | |
| 2004/0259449 A1 | 12/2004 | Onder de Linden et al. | |
| 2005/0025117 A1 | 2/2005 | Inagaki et al. | |
| 2005/0107104 A1 | 5/2005 | Rajkotia | |
| 2005/0113157 A1 | 5/2005 | Jaakola | |
| 2006/0016452 A1 | 1/2006 | Goetz et al. | |
| 2006/0026288 A1 | 2/2006 | Acharya et al. | |
| 2006/0028272 A1 | 2/2006 | Ozawa et al. | |
| 2006/0089138 A1 | 4/2006 | Smith et al. | |
| 2006/0146751 A1 | 7/2006 | Obuchi et al. | |
| 2006/0166663 A1 | 7/2006 | Haehnichen et al. | |
| 2006/0208794 A1 | 9/2006 | Morishima | |
| 2006/0281476 A1 | 12/2006 | Lane et al. | |
| 2007/0054643 A1 | 3/2007 | Kraegeloh et al. | |
| 2007/0073944 A1* | 3/2007 | Gormley | 710/72 |
| 2007/0254728 A1 | 11/2007 | Moallemi et al. | |
| 2007/0279237 A1 | 12/2007 | Julian et al. | |
| 2007/0281721 A1 | 12/2007 | Lee et al. | |
| 2008/0009275 A1 | 1/2008 | Werner et al. | |
| 2008/0045161 A1 | 2/2008 | Lee et al. | |
| 2008/0279167 A1 | 11/2008 | Cardei et al. | |

FOREIGN PATENT DOCUMENTS

| | | |
|---|---|---|
| CN | 1723677 A | 1/2006 |
| EP | 851403 A2 | 7/1998 |
| EP | 1469594 A1 | 10/2004 |
| GB | 2388279 | 11/2003 |
| JP | 5180925 | 7/1993 |
| JP | 10190880 A | 7/1998 |
| JP | 11146030 A | 5/1999 |
| JP | 2001169345 | 6/2001 |
| JP | 2001344352 A | 12/2001 |
| JP | 2002517855 A | 6/2002 |
| JP | 2002290944 A | 10/2002 |
| JP | 2003087863 A | 3/2003 |
| JP | 2003202976 A | 7/2003 |
| JP | 2004029182 A | 1/2004 |
| JP | 2004096453 A | 3/2004 |
| JP | 2004507714 T | 3/2004 |
| JP | 2004357281 A | 12/2004 |
| JP | 2005005962 A | 1/2005 |
| JP | 2005020350 A | 1/2005 |
| JP | 2005099018 A | 4/2005 |
| JP | 2005128965 A | 5/2005 |
| JP | 2005202873 A | 7/2005 |
| JP | 2005295380 A | 10/2005 |
| JP | 2006054800 A | 2/2006 |
| JP | 2006054815 A | 2/2006 |
| JP | 2008503011 A | 1/2008 |
| KR | 20030008999 A | 1/2003 |
| TW | 200307141 | 12/2003 |
| TW | I247131 | 1/2006 |
| WO | 9964952 A1 | 12/1999 |
| WO | WO0187014 A2 | 11/2001 |
| WO | WO0194974 | 12/2001 |
| WO | WO2004053655 A2 | 6/2004 |
| WO | WO2005083461 A1 | 9/2005 |
| WO | WO2005121959 A2 | 12/2005 |
| WO | 2006028547 | 3/2006 |

OTHER PUBLICATIONS

Galton, Ian "Delta-Sigma Data Conversion in Wireless Transceivers," IEEE Transactions on Microwave Theory and Techniques, IEEE Service Center, Piscataway, NJ, US, vol. 50, No. 1, Jan. 1, 2002, pp. 302-315.

European Search Report—EP08021227, Search Authority—Munich, Jan. 29, 2009.

Z. Shi, "Sigma-Delta ADS and DAC for Digital Wireless Communication." 1999 IEEE Radio Frequency Integrated Circuits Symposium, pp. 57-62.

I. Galton, "Delta-Sigma Data Conversion in Wireless Transceivers." IEEE Transactions on Microwave Theory and Techniques, vol. 50, No. 1, Jan. 2002, pp. 302-315.

Istephanian et al, "Guest Editorial Introduction to the Special Section on M-Health: Beyond Seamless Mobility and Global Wireless Health-Care Connectivity" IEEE Transactions on Information Technology in Biomedicine, IEEE Service Center, Los Alamitos, CA, US. vol. 8 No. 4, Dec. 2004 p. 405-414, XP011122717 ISSN: 1089-771 the whole document.

Jones at al, "Modelling Mobile Health Systems: An Application of Augmented MDA for the Extended Healthcare Enterprise" EDOC Enterprise Computing Conference, 2005 Ninth IEEE International Enschede, The Netherlands, Sep. 19-23, 2005, Piscataway, NJ, USA, IEEE p. 58-69; p. 60-66.

ISR-PCT-US07-121477—Oct. 25, 2007.

ISR-PCT-07-121476—Oct. 25, 2007.

European Search Report—EP10153190, Search Authority—Munich, European Search Authority—Mar. 11, 2010.

Gulden P., et al., "Wireless local positioning" IEEE Microwave Magazine IEEE Service Center Piscataway NJ, USA, vol. 4 (4), Dec. 2003, pp. 77-86, XP011107180.

Kredo K. et al., "Medium Access Control in Wireless Sensor Networks," Computer Networks, Dec. 28, 2006, pp. 961-994, vol. 51, No. 4, Elsevier Science Publishers BV Amsterdam, NL.

Magrath, A. J. et al.: "Hybrid Pulse Width Modulation/Sigma Delta Modulation Power Digital-to-Analogue Converter," IEEE Proceedings: Circuits Devices and Systems, Institution of Electrial Engineers, Stenvenage, GB, vol. 143, No. 3, Jun. 10, 1996, pp. 149-156.

Roboticsbased obstacleavoidance systems for the blind and visually impaired Navbelt and the guidecane, XP011095797, Mar. 2003.

Sekine M. et al., "An Energy-Efficient Protocol for Active/Sleep Schedule Synchronization in Wireless Sensor Networks," IEEE 2006 Asia-Pacific Conference on Communications, Aug. 2006, pp. 1-5.

Sundararaman B. et al., "Clock Synchronization for Wireless Sensor Networks: a Survey," Ad Hoc Networks, Elsevier, May 2005, pp. 281-323, vol. 3, No. 3, University of Illinois, Chicago, IL, USA.

(56) References Cited

OTHER PUBLICATIONS

Taiwanese Search report—096113704—TIPO—Jan. 9, 2011.
Taiwanese Search report—096114067—TIPO—Nov. 20, 2010.
Taiwanese Search report—096115093—TIPO—Oct. 11, 2010.
Vasudevan S. et al., "Design and Analysis of a Leader Election Algorithm for Mobile Ad Hoc Networks," Network Protocols, 2004, ICNP 2004, Proceedings of the 12th IEEE International Conference on Berlin, Germany, Oct. 5, 2004, pp. 350-360.
Written Opinion—PCT/US07/066887—International Search Authority, European Patent Office—Apr. 10, 2007.
Xu et al: "Distributed computing paradigms for collaborative signal and information processing in sensor networks" Aug. 1, 2004, Journal of Parallel and Distributed Computing, pp. 945-959, XP004525538.
Taiwan Search Report—TW096113668—TIPO—Mar. 16, 2011.
Written Opinion—PCT/US07/066887—International Search Authority, European Patent Office—Oct. 25, 2007.
International Preliminary Report on Patentability—PCT/US07/066887—International Search Authority, European Patent Office—Jul. 22, 2008.

\* cited by examiner

OFFLOADED PROCESSING FOR WIRELESS APPLICATIONS

CLAIM OF PRIORITY UNDER 35 U.S.C. §119

This application claims the benefit of and priority to commonly owned U.S. Provisional Patent Application No. 60/793,114, filed Apr. 18, 2006; U.S. Provisional Patent Application No. 60/794,039, filed Apr. 20, 2006; U.S. Provisional Patent Application No. 60/795,436, filed Apr. 26, 2006; U.S. Provisional Patent Application No. 60/795,445, filed Apr. 26, 2006; and U.S. Provisional Patent Application No. 60/795,512, filed Apr. 26, 2006; the disclosure of each of which is hereby incorporated by reference herein.

CROSS-REFERENCE TO RELATED APPLICATIONS

This application is related to concurrently filed and commonly owned U.S. patent application Ser. No. 11/736,480 entitled "WAVEFORM ENCODING FOR WIRELESS APPLICATIONS," the disclosure of which is hereby incorporated by reference herein.

BACKGROUND

1. Field

This application relates generally to wireless communication, and to offloaded processing for wireless applications.

2. Background

Various types of devices including, for example, cell phones, computers, and associated peripherals may utilize wireless communication technology to communicate with one another and with other devices. To facilitate such wireless communication, these devices perform various operations associated with the transmission and reception of data via one or more wireless communication links (e.g., a wireless network).

In a typical scenario a first device (e.g., a headset) may communicate via a wireless communication link (e.g., Bluetooth) with a second device (e.g., a cell phone) to send data to and receive data from a remotely-located device (e.g., a communication device connected to the Internet). Here, the first device may include a transducer (e.g., a microphone) or some other mechanism that generates data to be sent to the remote device. In addition, the first device performs various processing operations to facilitate transmitting the generated data to the second device via the wireless communication link. For example, the first device may convert analog generated data to digital data, attempt to improve one or more characteristics of the data, compress the data, and encode the data for transmission to the second device via the wireless communication link.

The second device may then perform various operations to facilitate transmission of the data to the remote device. For example, the second device may decode the data from the format used for the wireless communication link and then re-encode the data into an appropriate communication format for transmission over a network (e.g., a cellular network) to the intended destination.

Complementary operations may be performed for data traveling in the opposite direction. For example, upon receipt of data destined for the first device, the second device may perform various operations such as decoding data received via the network, decompressing the data as necessary, and re-encoding the data for transmission via the communication link to the first device. The first device may then perform operations such as decoding the received data and processing the decoded data, as necessary. The first device may then convert this digital data to analog data and provide the analog data to another transducer (e.g., a speaker).

From the above it may be appreciated that different devices in the communication system may have different processing requirements and, hence, different processing capabilities. In some cases, however, the processing capabilities conventionally associated with a given device may hinder or otherwise negatively affect other desirable features of the device. For example, in some applications it is desirable for a mobile device to be as small as possible and to consume as little power as possible. In practice, however, meeting these design goals may be difficult due to the processing requirements of the device.

SUMMARY

A summary of sample aspects of the disclosure follows. It should be understood that any reference to aspects herein may refer to one or more aspects of the disclosure.

The disclosure relates in some aspects to offloading processing for a wireless communication device. For example, processing conventionally performed by a first device may, instead, be performed by a second device on behalf of the first device.

Offloaded processing may be employed to improve or otherwise alter one or more attributes of a given device or system. In some aspects offloaded processing may be employed in the event the processing may be more effectively performed by another device. For example, one class of device may have more processing capabilities, more available power, or a larger footprint than another class of device. Consequently, a class of device from which processing has been offloaded may be advantageously adapted to consume less power, have a smaller footprint, and have a less complex design.

The disclosure relates in some aspects to offloading processing that would normally be performed on one device to another device, where the devices are connected wirelessly. Here, the offloaded processing may prove beneficial (e.g., according to some metric) for the overall system, even though an additional burden may be placed on one of the devices. In some aspects offloaded processing may be utilized if the cost associated with performing the processing is higher that the cost associated with performing any transmission associated with the offloading. For example, power savings may be realized at a device even if additional power is required to send data (e.g., the data is in an uncompressed form, so more data is sent) as long as more power is saved by not having to perform the processing (e.g., data compression).

In some aspects offloaded processing may be employed to enable a first device to process data for transmission and then wirelessly send the data to another device for processing. For example, the first device may preprocess an analog data (e.g., raw analog sensed data such as an analog waveform) for transmission (e.g., in an analog or digital form) to the second device, while the second device processes the received data to improve a least one characteristic represented by the analog data. In this way, the second device may perform one or more processing operations on behalf of the first device. For example, the second device may process the received data to improve at least one characteristic such as sound or imagery, or at least one characteristic such as an indication of heart rate, temperature, pressure, velocity, or acceleration. Here, processing such as equalization, echo cancellation, active noise reduction, filter and decimate operations, side-tone generation, filter tap generation, biological processing, ambient condition processing, and voice command and recognition operations may be performed at the second device rather than at the first device.

In some implementations the first device may waveform encode the analog output of a transducer and send the resulting data via a wireless link to the second device. The second device may then process the received data on behalf of the first device. Here, the waveform encoded data may comprise digital data that represents the entire waveform (e.g., the waveform encoded data is of a form that could be converted back to an analog form to essentially reconstruct the waveform). In some implementations the waveform encoded data comprises pulse code modulated data or sigma delta modulated data. In some implementations the waveform encoded data may be preprocessed (e.g., encoded, packetized, and so on) for reliable transmission across the wireless link.

In some aspects offloaded processing may be employed whereby a first device processes data on behalf of a second device and then sends the processed data to the second device. For example, the first device may process received data and waveform encode the processed data for transmission back to the second device. The second device may then process the received waveform encoded data to provide a desired output based on the data. Here, the second device may pass the received waveform encoded data directly to an output transducer.

In some aspects offloaded processing may be implemented in a static manner or in a dynamic manner. As an example of static offloaded processing, a first device may be adapted (e.g., implemented) to not provide certain processing capabilities, while a second device may be adapted to provide those processing capabilities. In addition, provisions may be made to enable the second device to perform the corresponding processing on behalf of the first device.

As an example of dynamic offloaded processing, both a first device and a second device may be adapted to provide certain processing capabilities. In addition, the devices may be adapted to be configurable so that a dynamic selection may be made as to which of the devices is to perform a given processing operation. For example, one of the devices may send a message to the other device to indicate which of the devices is to perform a given operation or operations.

BRIEF DESCRIPTION OF THE DRAWINGS

These and other features, aspects and advantages of the disclosure will be more fully understood when considered with respect to the following detailed description, appended claims and accompanying drawings, wherein:

FIG. 2, including

FIG. 14, including

Figure 1:
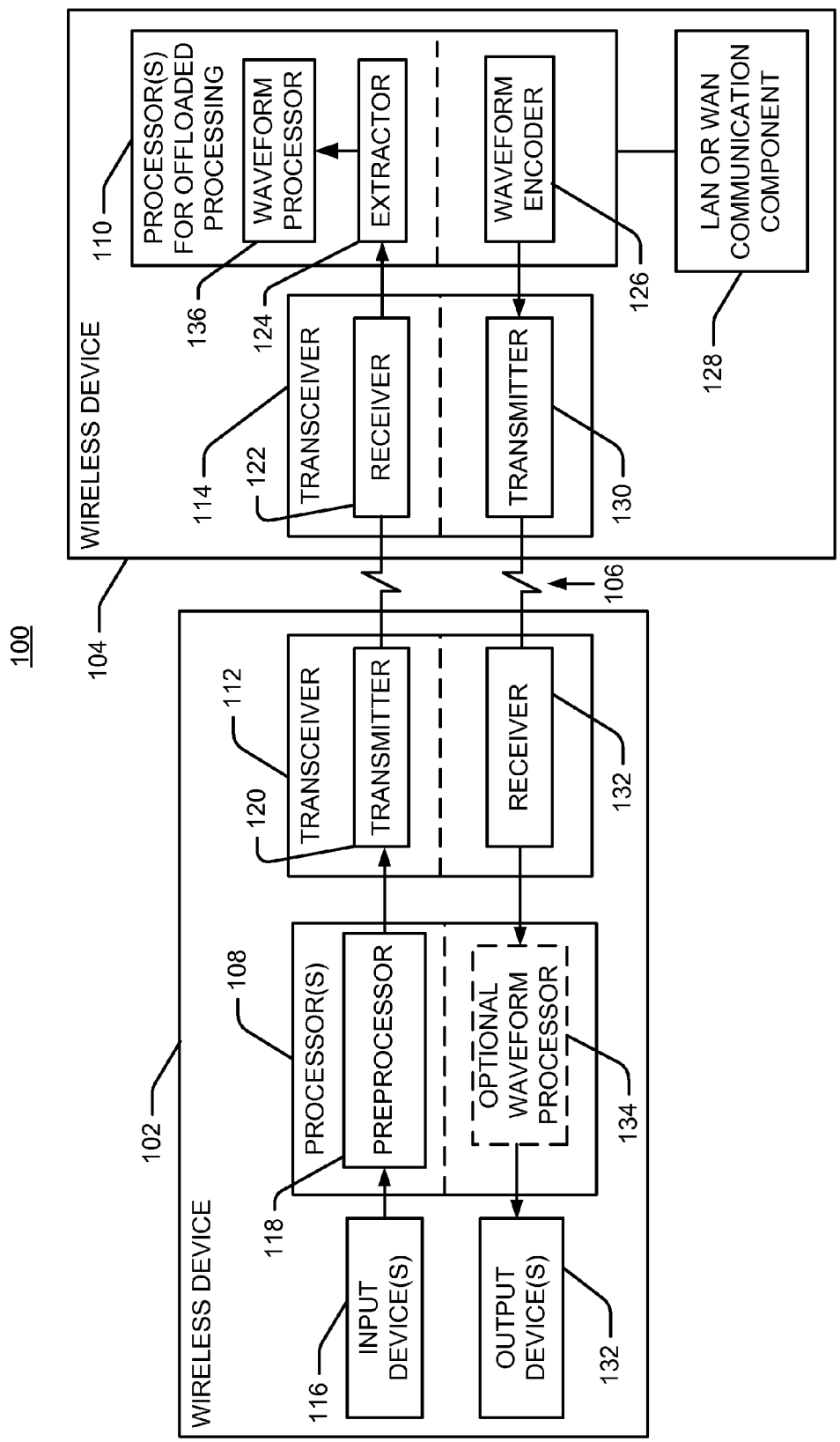
FIG. 1 is a simplified block diagram of several sample aspects of a communication system adapted to provide offloaded processing.

In accordance with common practice the various features illustrated in the drawings may not be drawn to scale. Accordingly, the dimensions of the various features may be arbitrarily expanded or reduced for clarity. In addition, some of the drawings may be simplified for clarity. Thus, the drawings may not depict all of the components of a given apparatus (e.g., device) or method. Finally, like reference numerals may be used to denote like features throughout the specification and figures.

DETAILED DESCRIPTION

Various aspects of the disclosure are described below. It should be apparent that the teachings herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. For example, in some aspects a method of processing data comprises receiving data, wherein the received data comprise analog data obtained and preprocessed by another device for wireless transmission, and processing the received data to extract at least one characteristic represented by the analog data. In addition, in some aspects a method of processing data also comprises transmitting the processed data to the other device.

FIG. 1 illustrates sample aspects of a communication system 100 where a first wireless device 102 may communicate with a second wireless device 104 via a wireless communication link 106. In some implementations the devices 102 and 104 may comprise at least a portion of a wireless network. For example, the devices 102 and 104 may associate with one another, and optionally one or more other devices, to establish or join a body area network, a personal area network, or some other type of network.

In some aspects the devices 102 and 104 are adapted such that the device 104 may perform processing on behalf of the wireless 102. For example, rather than performing a given processing operation at the device 102, the processing may be offloaded to the device 104. To this end, the devices 102 and 104 include one or more processor components 108 and 110, respectively, to perform operations to facilitate this offloaded processing. In addition, the devices 102 and 104 include transceivers 112 and 114, respectively, for sending data between the devices 102 and 104.

Offloaded processing may be employed in a variety of scenarios where multiple devices having different capabilities communicate with one another to support certain functionality. For example, a wireless body area network may include one or more wireless medical sensors that are distributed on a user's body. Each of these sensors may send sensed data to a central node such as a cell phone or a personal data assistant ("PDA"). Another example involves a wireless headset (e.g., an earpiece) that communicates with a cell phone, a music player, or some other device. Yet another example is a tire pressure monitor that is located in a wheel of a car where the monitor sends pressure readings back to a dashboard-mounted device via a wireless link. In these scenarios one of the devices (e.g., the sensors and headset) is generally of lower complexity and generally consumes less power than the other device (e.g., the cell phone or the dashboard-mounted device).

Typically, low complexity and low-power devices such as these generate raw data that need to be processed before being used. Examples of such processing include echo cancellation at the headset to reduce the effects of surrounding noise, equalization, data compression of a heartbeat waveform, and audio compression. In some cases, the processed data are sent to another device for ultimate use. For example, audio data generated by a headset may be compressed before it is transmitted to a remote device for playback. In other cases the processed data are ultimately used at the low complexity, low-power device. For example, active noise reduction generates modified audio data that are played back at the headset. Conventionally, the processing discussed above is performed on the low complexity, low-power device.

By offloading processing from a low power, low complexity device to a higher power, higher complexity device as taught herein, one or more advantages may be obtained in the overall system. For example, moving processing from a low power, low complexity device to a higher power, higher complexity device allows the low power, low complexity device to be of even lower power and lower complexity. Consequently, such a device, which may be sold in much greater numbers than the other device, may cost less to manufacture, may be smaller (e.g., through the use smaller batteries and less circuitry) and hence more user friendly, and may require less frequent recharges or battery replacements. In addition, economies of scale may exist when multiple devices are deployed in a network. For example, in a scenario where an audio player multicasts an audio stream to several headsets, performing the active noise cancellation on the audio player reduces the complexity and the power draw of multiple headsets while only increasing the complexity and power consumption of a single device (i.e., the audio player).

In the example of FIG. 1, the device 102 includes one or more input devices 116 that generate waveform data that may need to be processed. In some implementations the data to be processed by the device 104 comprise raw data. For example, the device 102 may not process the data from the input device 116 for any purpose other than for transmission to the device 104. Thus, the device 102 may not process the data to improve any characteristic represented by the data. As a specific example, the device 102 may not process the data to improve an attribute such as frequency response, signal-to-noise ratio, or accuracy of a multimedia waveform, a biological waveform, or an ambient waveform represented by the data.

In some aspects the device 102 includes a preprocessor 118 that may preprocess the data (e.g., the raw analog data) for transmission to the device 104. For example, the preprocessor 118 may perform waveform processing on the data. Such waveform processing may include, for example, pulse code modulation encoding or sigma delta modulation encoding. Thus, the device 102 may transmit waveform data to the device 104, as opposed to waveform data that has been further processed (e.g., compressed, as may be transmitted in a conventional system).

The preprocessor 118 also may perform operations such as, error coding, scrambling, etc, to facilitate transmitting the data. A transmitter 120 is then used to transmit the preprocessed data to a receiver 122 of the device 104.

After the device 104 receives the waveform data from the device 102, the processor 110 of the device 104 may process the waveform data on behalf of the device 102. For example, the processor 110 may process the data to improve one or more characteristics represented by the data (e.g., as discussed above).

In some aspects improving the at least one characteristic represented by the data (e.g., the raw analog waveform data) may comprise extracting (e.g., by an extractor component 124) at least one characteristic represented by the data (e.g., the raw analog data) generated by the device 102. For example, extraction may involve extracting a voice signal from the received data (representative of the raw sensed data), extracting a biological parameter (e.g., a heart beat waveform), extracting an ambient parameter (e.g., a pressure waveform), or some other similar operation. Advantageously this process may be performed in a manner that improves a characteristic represented by the data. For example, extraction may involve filtering, denoising, noise cancellation, or some other suitable technique.

In some aspects extraction may involve extracting an indication relating to the received data (representative of the raw sensed data). For example, extraction may comprise extracting an indication of a biological parameter (e.g., a heart rate value), extracting an indication of an ambient parameter (e.g., a pressure value), or some other similar indication. Again, such a process may be performed in a manner that improves a characteristic represented by the data. For example, indications of a heart rate (e.g., as derived from multiple sensors that detect a heart beat waveform) may be averaged to provide an improved ultimate heart rate value. Similar operations may be performed for other indications of a biological or ambient parameter. Improving a characteristic also may comprise improving machine readability or human readability of values represented by the analog data. For example, extracting or computing an indication of heart rate (or some other parameter) may improve the characteristic of machine readability or human readability of the analog data. Here, an indication of a heart rate (or some other parameter) may be obtained (e.g., extracted or computed) by converting pulses from a sensor to a numeric heart rate value (or some other type of value).

In conjunction with the extraction (or following the extraction) a waveform processor 136 may perform the desired waveform processing on the extracted waveform data. For example, as will be discussed in more detail below, such waveform processing may involve improving at least one characteristic of the data by performing operations such as equalization, echo cancellation, active noise cancellation, filter tap computation, side-time processing, biological-related (e.g., medical-related) processing, voice-command and recognition, and processing of ambient conditions.

The processing may thereby improve at least one attribute of a characteristic. Such an attribute may relate to, for example, frequency response, signal-to-noise ratio, or accuracy. In some aspects the extraction process may involve, for example, substantially reconstructing data representative of the waveform data (e.g., the raw data) generated by the device 102.

In some aspects, the result of the extraction process may provide data that have less degradation of the least one characteristic, as compared to the data generated by the device 102 (e.g., the analog raw data). For example, there may be less noise in the extracted data relative to the characteristic represented by the data (e.g., an audio waveform) than in the raw analog data. Similarly, the magnitude of any interference-related component in the extracted data may be less than the magnitude of such a component in the raw analog data. It should be appreciated that the processing performed here (e.g., relating to a characteristic represented by the data) may be distinguishable from processing that simply operates on the data (e.g., compressing or decompressing the data).

A characteristic represented by the data may relate to various types of data (e.g., multimedia data, biological data, and ambient data) and various aspects of that data. For example, a characteristic represented by data may comprise audio, music, voice, speech, video, a heart beat, blood pressure, body temperature, oxygen concentration levels, glucose levels, pressure, temperature, velocity, acceleration, or some other event or condition.

In addition, as mentioned above a characteristic represented by the data may comprise an indication relating to one or more of the above events and conditions. For example, an audio-related characteristic may comprise a noise level of the audio, an audio-related characteristic may comprise a pleasantness of the audio to the human ear, a heart beat-related characteristic may comprise a computed heart rate, a pressure-related characteristic may comprise a computed blood pressure value, a temperature-related characteristic may comprise a computed temperature value, an oxygen concentration-related characteristic may comprise a computed value of oxygen concentration, a glucose level-related characteristic may comprise a computed glucose level value, a temperature-related characteristic may comprise a computed temperature value, a velocity-related characteristic may comprise a computed velocity value, and an acceleration-related characteristic may comprise a computed acceleration value.

Also as discussed above, in some aspects the offloaded processing may improve at least one of the characteristics represented by the data. For example, improving an audio-related characteristic may comprise reducing noise in audio or improving pleasantness of the audio to the human ear (e.g., adding side-tones). Improving a biological related-characteristic may comprise improving a calculation (e.g., improving the accuracy of the calculation) for determining a heart rate, blood pressure, etc. Improving an ambient-related characteristic may comprise improving a calculation (e.g., improving the accuracy of the calculation) for determining pressure, velocity, etc.

In some aspects the processor 110 may process the data to facilitate transmission to the device 102 and, in some cases, to further reduce the processing required by the device 102. For example, a waveform encoder 126 may provide processed data in a waveform encoded form such as pulse code modulated data or sigma delta modulated data. This data may then be transmitted to the device 102 without any further processing (e.g., compression) other than standard transmission-related processing. Thus, the device 104 also may transmit waveform data to the device 102, as opposed to processed data representative of the waveform. As will be discussed below, in this case less processing may be performed at the device 102 since the device 102 will receive data in a form that may be readily provided to an output device.

After the data is processed, the device 104 sends the data to the appropriate destination. For example, a local area network or wide area network communication component 128 of the device 104 may send the processed data to another device via an appropriate communication link (e.g., to a wide area network such as a cellular network or to the Internet, not shown in FIG. 1).

As discussed above, the device 104 may send the processed data back to the device 102. This may be the case, for example, in the event the device 102 is the ultimate user of the data or in the event the device 102 is better suited to forward the processed data to the ultimate destination. Here, the processor 110 may encode the data, as necessary, depending upon the transmission scheme used over the link 106 and then provide the encoded data to a transmitter 130.

A receiver 132 of the device 102 may then provide the received data to the processor 108 for communication-related processing. For example, the processor 108 may decode the received data, as necessary, depending upon the transmission scheme used over the link 106.

The processor 108 may further process the received data to provide the data in a form suitable for output via one or more output devices 132. Advantageously, in the event the wireless device 104 provided the data in a waveform encoded format, relatively minimal processing may be required here. For example, a waveform processor 134 may process received pulse code modulated data or sigma delta modulated data to generate analog data or may process pulse code modulated data to generate sigma delta modulated data that is provided to the output device 132. Moreover, in some implementations sigma delta modulated data may be provided directly to the output device 132.

To further illustrate how offloaded processing may be implemented, an example of offloaded processing will be briefly discussed in the context of an implementation where the device 104 comprises a wireless device such as a cell phone or an entertainment device (e.g., an audio player) and the device 102 comprises a headset for the wireless device. In this use case, various types of processing may be offloaded from the headset 102 to the device 104. For example, in some implementations it may be desirable to provide echo cancellation or active noise cancellation for the headset 102. Here, the input device 116 may comprise a microphone that senses ambient sound. The headset 102 may thus transmit the raw sensed ambient sound data (e.g., a waveform) to the device 104 as discussed above.

The device 104 processes the raw sensed data in conjunction with other input data to provide, for example, the desired equalization, equalizer tap weight computation, echo cancellation or active noise cancellation. In the case of an audio player, the other input data may comprise data (e.g., the audio waveforms) to be played out by the headset 102. This input data may be generated by the device 104 or may be received from another device via the communication component 128.

The device 104 transmits the processed data (e.g., equalized data, tap weights, echo cancelled data, noise cancelled data) back to the headset 102 or to some other destination. In the former scenario, the headset 102 may then provide the received processed data to a speaker 132. Here, it should be appreciated that the operations discussed above may be performed fast enough to provide effective echo cancellation, active noise cancellation, or some other type of processing.

Figure 2A:
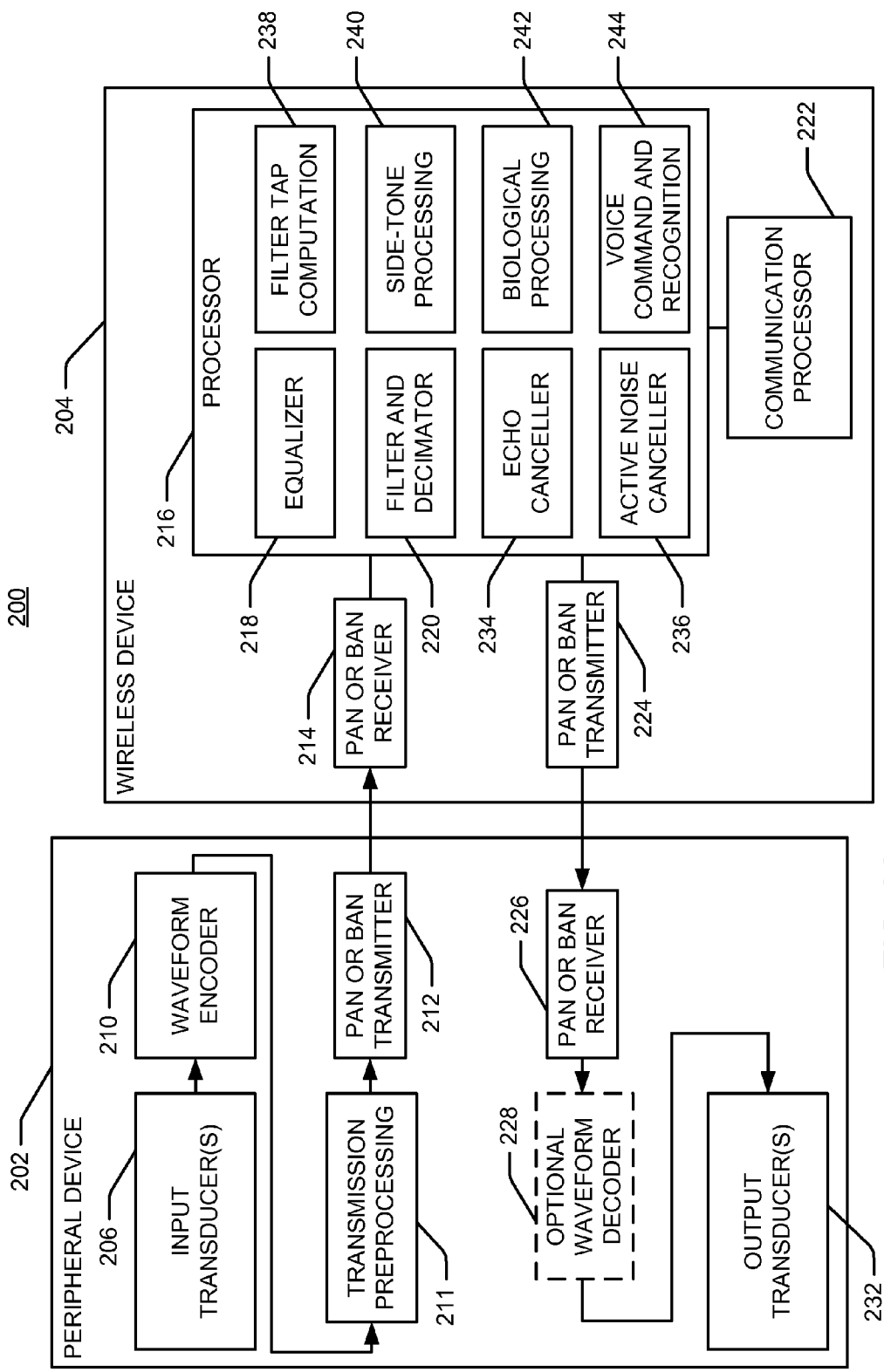
FIGS. 2A and 2B, depicts simplified block diagrams of several additional sample aspects of apparatuses adapted to provide offloaded processing.
Figure 3:
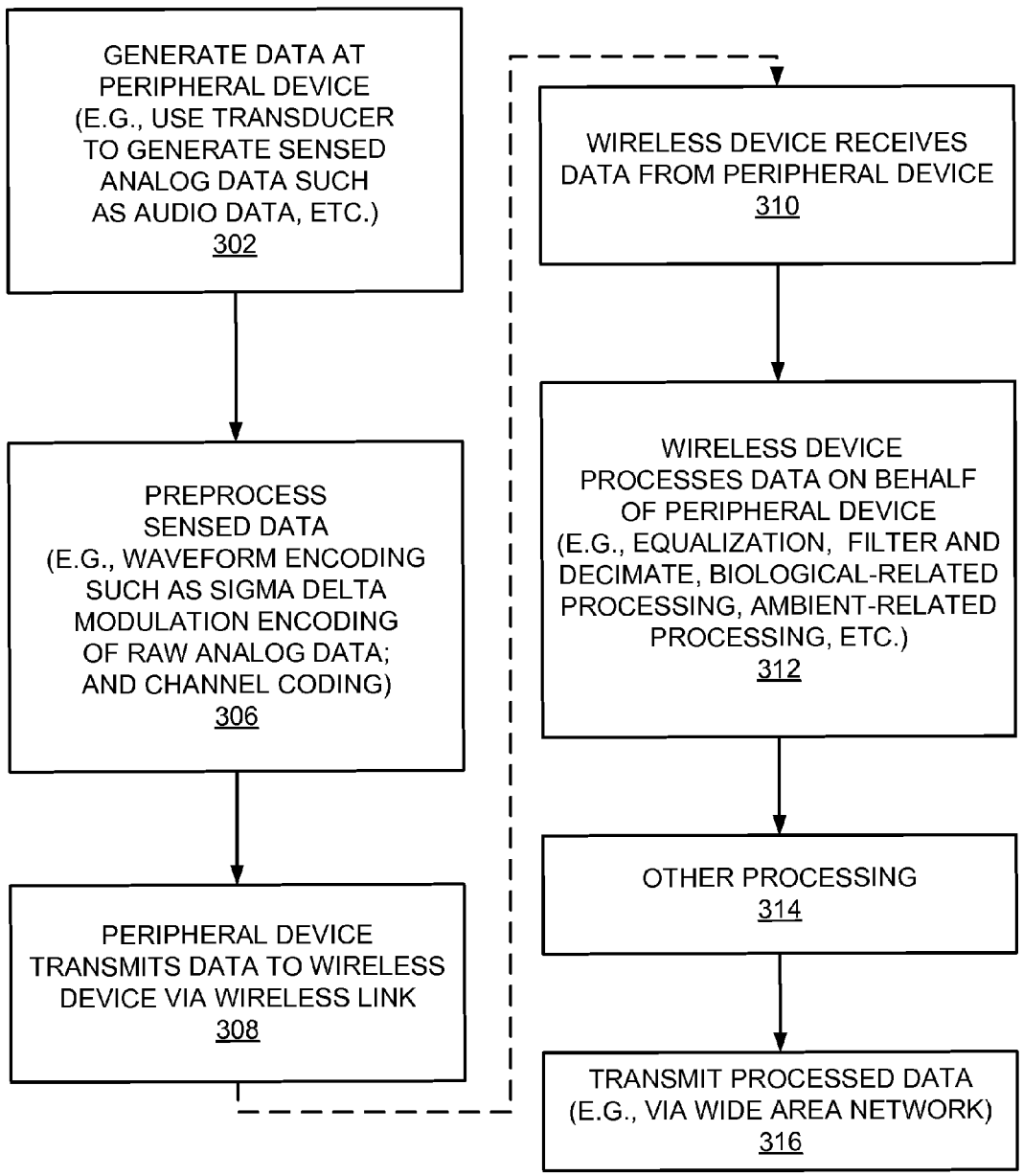
FIG. 3 is a flowchart of several sample aspects of operations that may be performed to provide offloaded processing for received data.
Figure 4:
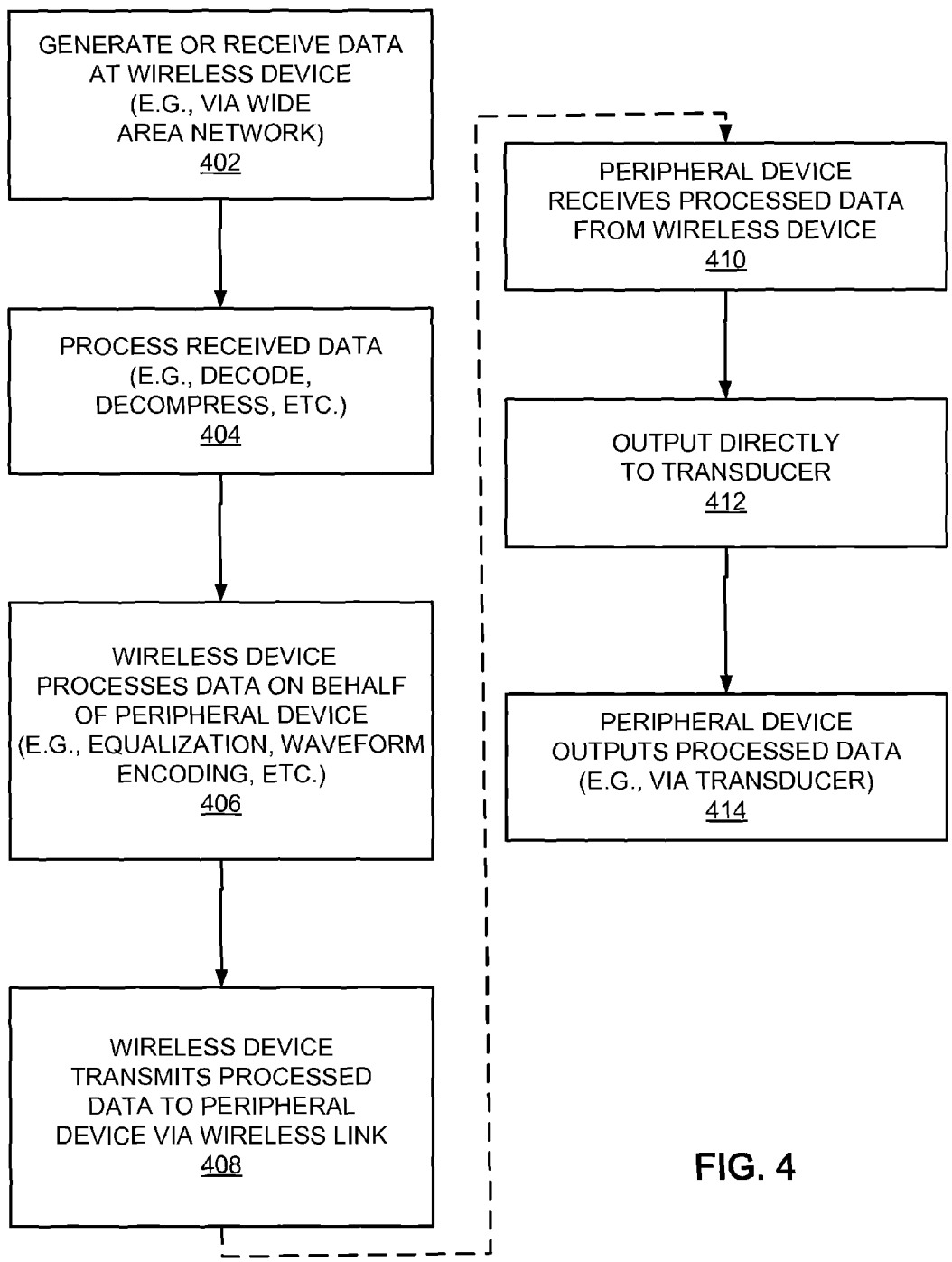
FIG. 4 is a flowchart of several sample aspects of operations that may be performed to provide offloaded processing for data to be transmitted to another device.

With the above overview in mind, additional details of a system incorporating offloaded processing and associated operations will be discussed in more detail in conjunction with FIGS. 2A, 3, and 4. FIG. 2A illustrates sample components of a system 200 including a wireless peripheral device 202 and a wireless device 204 that may, in one or more aspects, be similar to the wireless device 102 and the wireless device 104, respectively. FIG. 3 relates to operations that may be performed, for example, to transmit data from a device that generates sensed data to another device. FIG. 4 relates to operations that may be performed, for example, to transmit data from a device to another device that outputs the data. For convenience, the operations of FIGS. 3 and 4 (or any other operations discussed or taught herein) may be described as being performed by specific components (e.g., the system 200). It should be appreciated, however, that these operations may be performed by other types of components and may be performed using a different number of components. It also should be appreciated that one or more of the operations described herein may not be employed in a given implementation.

FIG. 2A describes an example where the device 202 is a peripheral device of the wireless device 204. For example, the wireless device 204 may comprise a wireless station that is in communication with one or more other devices (e.g., a wireless access point). In some implementations the wireless device 204 may comprise a cell phone. In this case, the peripheral device 202 may comprise, for example, a peripheral such as a headset, a watch, medical device, or some other suitable device. It should be appreciated that the teachings herein may be implemented in a variety of ways other than those specifically described herein. Hence, in other implementations the device 202 may not be a peripheral device.

FIG. 2A also describes an example where the devices 202 and 204 communicate via air interfaces for a body area network or a personal area network. It should be appreciated however, that the devices 202 and 204 may communicate using other types of communication links.

Referring now to FIG. 3, in some aspects offloaded processing may relate to a scenario where one device receives data from another device and then processes the data on behalf of that other device. As represented by block 302, an input transducer 206 (e.g., a sensor) of the device 202 in FIG. 2A generates data that correspond to the transducer type. For example, in some implementations the transducer 206 may be adapted to sense a multimedia characteristic such as an audible characteristic (e.g., sound, audio, voice, or music), a visual characteristic (e.g., still imagery such as a picture or moving imagery such as video), or some combination of two or more of these characteristics, to generate multimedia data. In some implementations the transducer 206 may be adapted to sense a biological-related characteristic such as a heartbeat, blood pressure, body temperature, oxygen concentration levels, glucose levels, and so on. In some implementations the transducer 206 may be adapted to sense an ambient-related characteristic such as pressure, temperature, velocity, acceleration, and so on.

In some aspects sensed data generated by the transducer 206 is in the form of analog data. Such analog data may represent, for example, a continuous waveform (e.g., audio data), a non-continuous waveform (e.g., a heartbeat), or information that is more discrete in nature (e.g., pressure, velocity, etc.).

As represented by block 306, the device 202 preprocesses the sensed data for transmission. As discussed above, in some implementations the preprocessing may involve waveform encoding the sensed data (e.g., the raw analog data output by the transducer 206). Here, a waveform encoder 210 may perform operations such as sigma delta modulation encoding, pulse code modulation encoding, or some others suitable form of waveform encoding. By converting the analog data to digital form, the raw waveform data may be readily transmitted over a communication link that utilizes digital transmission.

Here, it should be appreciated that the data may be sent over the communication link at a relatively high data rate. For example, rather than sending compressed data to the device 204, the data may be sent in a full pulse code modulated form or in an oversampled form (e.g., sigma delta modulated data). Thus, in contrast with conventional techniques that compress the data before sending it over a communication link (e.g., using sub-band coding in conjunction with Bluetooth, MP3, or stereo encoding) and decompress received data, less processing may be involved with the disclosed approach. For example, for transmission, a conventional technique may convert sigma delta modulated data to pulse code modulated data and may compress pulse code modulated data before transmitting the data. Conversely, the receive side may involve decompressing data to provide pulse code modulated data or converting pulse code modulated data to signal delta modulated data.

Although the disclosed approach may require more wireless bandwidth than approaches that use compression, a favorable tradeoff may be achieved particularly in applications that use a relatively high bandwidth communication channel, that are able to transmit data more efficiently, or both. This may be the case, for example, in applications that employ ultra-wideband communication (e.g., impulse-based ultra-wideband).

The use of sigma delta modulation also may facilitate more reliable transmission of data over the wireless link. For example, given that every bit in a sigma delta modulated signal is, in effect, a least significant bit, a loss of a given bit during transmission may not have a significant effect on the recovered data. In contrast, in schemes that send full pulse code modulated data (e.g., 16 bit PCM) over a link, a loss of any of the more significant bits may have a significant negative impact on the recovered data.

The device 202 also may preprocess the sensed data to facilitate reliable transmission over the communication link. For example, a transmission preprocessing component 211 may provide channel coding, error coding, scrambling, interleaving, formatting, or other similar signal processing.

As represented by blocks 308 and 310, a transmitter 212 transmits the preprocessed data via a wireless communication link to a receiver 214 of the device 204. The device 204 may then perform processing complementary to some of the preprocessing performed at block 306 to recover the waveform encoded data generated at block 306. For example, one or more processors 216 of the device 204 may perform channel decoding, error decoding, descrambling, deinterleaving, deformatting, or other similar operations.

As represented by block 312, the processor 216 of the device 204 may then process the received data on behalf of the device 202. To this end, the processor 216 may extract at least one characteristic represented by the sensed analog data. As discussed above, this may involve substantially reconstructing the original analog data from the received data (e.g., generating data representative of the original waveform, plus quantization noise). For example, the processor 216 may derive sigma delta modulated data, pulse code modulated data, or analog data that will then be further processed on behalf of the device 202.

The processing of block 312 may take various forms depend upon the requirements of a particular application. In some implementations (e.g., where the waveform data comprise audio data) an equalizer 218 may equalize the received data (e.g., to improve the frequency response of the audio waveform). Thus, in this case, the equalization components and the power consumption associated with the equalization processing may be offloaded from the device 202 to the device 204. It should be appreciated that the processing may be offloaded in various ways. As discussed below, in some implementations only a portion of the processing may be offloaded. For example, the device 202 may perform the equalization filtering while computation of tap weights may be offloaded to the device 204.

In implementations where the waveform encoding of block 210 was sigma delta encoding, a filter and decimator 220 may process the sigma delta modulation data to, for example, complete the analog-to-digital conversion process. That is, the filter and decimator 220 may generate pulse code modulation data from the sigma delta modulation data. This configuration may thus reduce the number of components and the power consumption of the device 202 by performing these operations on the device 204.

FIG. 2A illustrates several other processing components that may perform processing on behalf of the device 202. For example a filter tap computation component 238 may compute equalizer filter taps for the device 202. In this case, the data the device 202 transmits to the device 204 may comprise information to be utilized for the tap weight computation. After performing the necessary processing, the component 238 may then send the computed tap weights back to the device 202.

In some implementations a side-tone processing component 240 may add side-tone information to information destined for the device 202. In this case, the device 202 may send audio (e.g., voice) from a microphone to the device 204. The component 240 may then add this information (e.g., reduced by 10 dB) to audio (e.g., voice traffic) being sent to the device 202 for playback on a speaker.

In some implementations a biological processing component 242 may perform biological-related processing for the device 202. For example, the component 242 may receive sensor data (e.g., heart beat information) from the device 202 (e.g., a medical device) and process the data and, in some cases provide feedback to the device 202 or to some other device based on the sensor data. In some implementations the component 242 may detect EKG anomalies and exceptions and then cause one or both of the device 202 and 204 (or some other device) to change a mode of operation.

In some implementations a voice command and recognition component 244 may perform voice recognition-related processing for the device 202. For example, the device may send sensor data (e.g., from a microphone) to the device 204. The component 244 may then perform voice and command recognition processing on the sensor data and send the results (e.g., an index value representative of the command) back to the device 202.

As will be discussed in more detail below, the processor 216 may include other components for performing offloaded operations. These operations may relate to, for example, echo cancellation, active noise cancellation, processing of biological-related data, and processing of ambient-related data.

As represented by block 314, the device 204 may perform other processing depending upon the requirements of a given implementation. For example, in some implementations the processed data from block 312 may be transmitted to some other device. Accordingly, the processed data may be formatted as necessary (e.g., by a communication processor 222) for transmission via an appropriate communication link (not shown in FIG. 2A) such as, for example, a wide area network (block 316).

Referring now to FIG. 4, in some aspects offloaded processing may relate to a scenario where one device processes data on behalf of another device before sending the processed data to the other device. As represented by block 402, data destined for the device 202 may be generated at the device 204 or received at the device 204. As an example of the former scenario, the device 204 may comprise an entertainment device (e.g., a music player) that generates audio data to be played out by the device 202. As an example of the latter scenario, the device 204 may comprise a wireless station (e.g., a cell phone) that receives voice data to be played out by the device 202.

As represented by block 404, the processor 204 may process the received data. For example, the communication processor 222 may perform various decoding operations to recover data transmitted via a wide area network or in some other manner. In addition, as will be discussed in more detail below, the wireless device 204 may decompress the received or generated data in the event the data was previously compressed.

As represented by block 406, the processor 216 may then process the data on behalf of the device 202. Again, the processor 216 may improve at least one attribute associated with at least one characteristic represented by the data. For example, in a similar manner as discussed above, the equalizer 218 may equalize data destined for the device 202. Also, as will be discussed in more detail in conjunction with FIG. 8 below, the processor 216 may process data generated or received by the wireless device 204 in conjunction with data received from the device 202 to provide data to be sent back to the device 202.

As discussed above in conjunction with FIG. 1, the processor 216 may waveform encode data destined for the device 202 to enable the device 202 to more efficiently output the data. Again, rather than sending compressed data to the device 202, the data may be sent in a full pulse code modulated form or in an oversampled form (e.g., sigma delta modulated data) so that the device 202 need not decompress the received data. Moreover, as will be discussed in more detail below in conjunction with FIGS. 5-7, an additional advantage may be achieved in some applications by transmitting sigma delta modulated data over the wireless link.

As represented by blocks 408 and 410, a transmitter 224 of the device 204 transmits the processed data via a wireless link to a receiver 226 of the device 202. In a similar manner as discussed above, the devices 204 and 202 may perform various operations (e.g., relating to channel coding/decoding, etc.) to facilitate transmitting and receiving the data via the wireless link.

The device 202 may optionally waveform decode the received data. For example, in the event the processor 216 generated waveform encoded data, a waveform decoder 228 may perform waveform decoding operations to convert the waveform data into analog data or sigma delta modulated data.

As represented by block 412, in some implementations processing of the received waveform encoded data (e.g., sigma delta modulated data) may simply involve the receiver 226 directly passing the waveform data to an output transducer 232 (e.g., to a buffer for the transducer 232). In this case, the device 202 may not perform any non-transmission related processing of the received data. Such an implementation will be discussed in more detail below in conjunction with FIGS. 6 and 7.

In any event, as represented by block 414, data in the appropriate format are provided to the transducer 232 that outputs the data in the appropriate manner. For example, a speaker may be used to output some form of audio data.

Figure 2B:
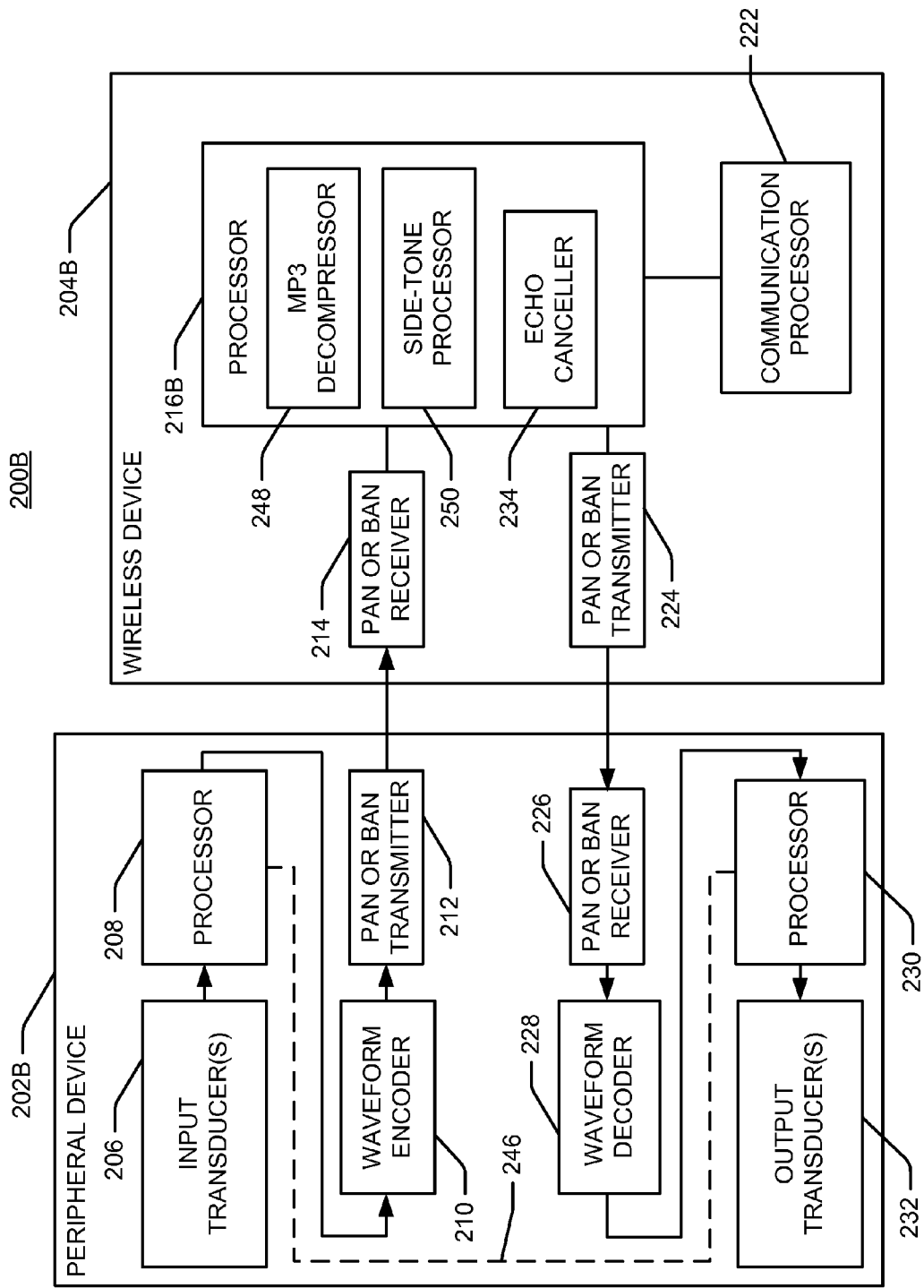

Offloaded processing may be implemented in a variety of ways and used to support various functionality. In some implementations one or both of the devices 202 and 204 may optionally provide additional processing. In some implementations only a portion of the processing that would otherwise be performed by the device 202 may be offloaded to the device 203. In some implementations a decision as with whether to offload processing may be made in a dynamic manner. FIG. 2B illustrates a system 200B with devices 202B and 204B that include several components that may be used in implementations such as these. In general, the components of FIG. 2B that have the same or similar reference designations as components of FIG. 2A may have the same or similar functionality as well.

As discussed above, in some implementations all non-transmission related processing of the sensed data may be offloaded to the wireless device 204. However, in some implementations some processing may still be performed by the device 202. Accordingly, as shown in FIG. 2B in some aspects the device 202B may optionally include a processor 208 for processing the sensed data.

Also as discussed above, in some implementations all non-transmission related processing of the sensed data being sent to the device 202 may be offloaded to the wireless device 204. However, in some implementations some processing may still be performed by the peripheral device. Accordingly, as shown in FIG. 2B in some aspects the device 202B may optionally include a processor 230 for processing the received data.

In some implementations the device 202B may perform some processing and offload other processing onto device 204B. For example, the device 202B (e.g. a headset) may have processing capabilities (e.g., provided by processor 230) relating to one or more of MP3 decompression, echo cancellation, and side-tone generation. As represented by line 246, the processor 230 may receive information for some of this processing (e.g., the side-tone generation) from the input transducer 206. In addition, the device 204B (e.g., a cell phone) may include processing capabilities to provide one or more of these operations. For example, one or more processors 216B may include an MP3 decompressor 248, a side-tone processor 250, or an echo canceller 234. Hence, depending on the requirements of a given application, the devices 202B and 204B may be configured so that the device 204B receives sensor data from the device 202B to perform one or more of the operations to be offloaded from the device 202B.

In some implementations processing may be offloaded in a dynamic manner. For example, the device 202B may detect that the device 204B has the capability to perform the same types of operations that the device 202B may perform (e.g., MP3 decompression, etc.). Consequently, the device 202B may shut down its circuits or disable its functionality and use the processing of the device 204B as long as the device 202B is communicating with the device 204B. Thus, when operating on its own, the device 202B may provide its own processing (e.g., streaming MP3 music from a FLASH dongle without MP3 decompression capability). In addition, if the charge on the battery of the device 204B drops below a critical point, the device 204B may stop providing offloaded processing (e.g., decompressing MP3 data), and may instead send unprocessed data (e.g., compressed MP3 data) to the device 202B, whereby the device 202B will perform the processing. In another use case, the device 202B (e.g., a heart rate monitor sensor) may initially send processed sensor data (e.g., a measured heart rate) to a second device that does not have offloading-related processing capabilities (e.g., the device may be a watch that simply displays the information). Then, at some other time, the device 202B may send the unprocessed sensor data (e.g., a heart beat waveform) to another device 204B (e.g., a cell phone) that does have the appropriate processing capabilities (e.g., heart rate detection).

Figure 5:
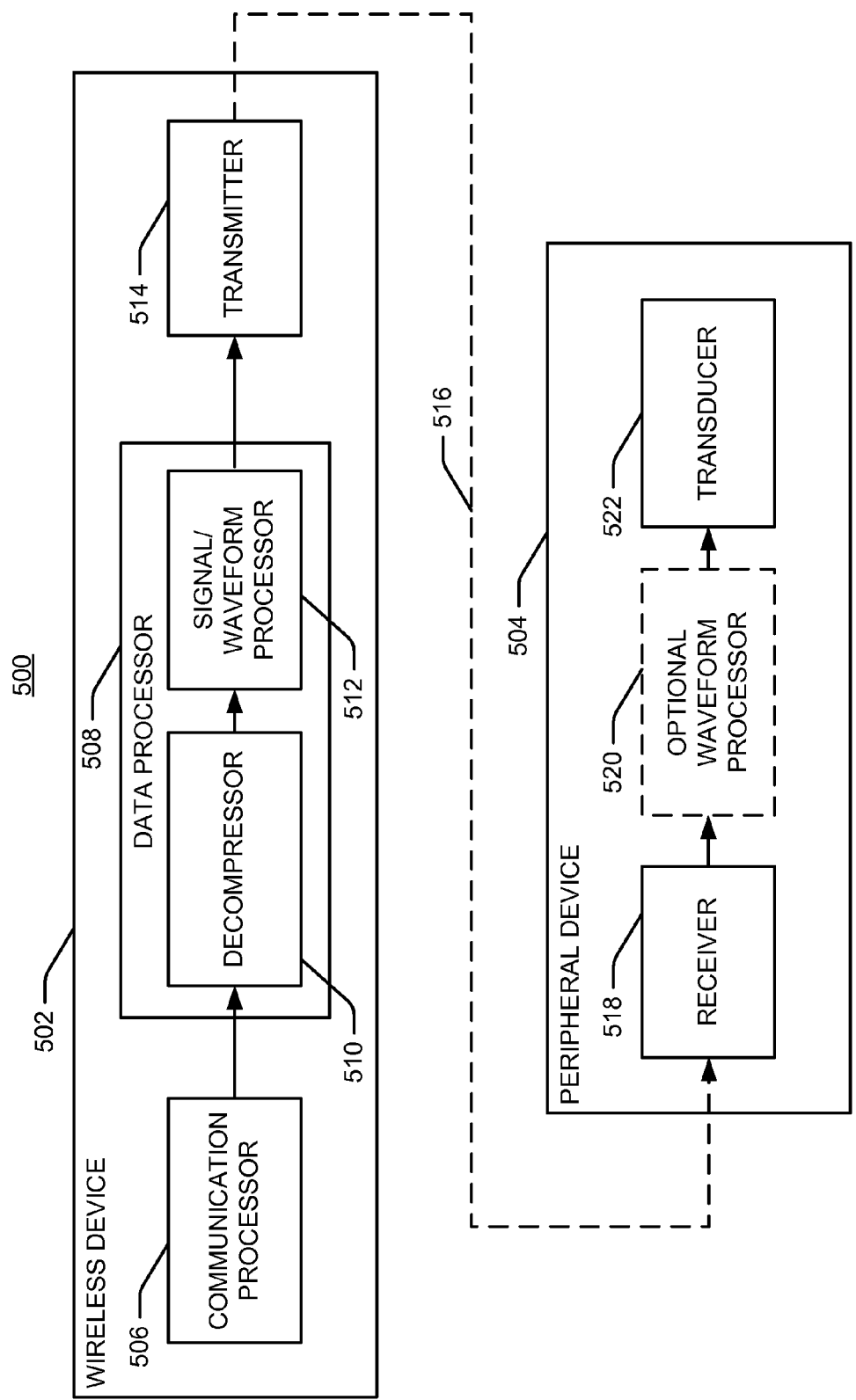
FIG. 5 is a simplified block diagram of several sample aspects of apparatuses adapted to provide offloaded processing for data to be transmitted.

The wireless device 204 of FIG. 2A may perform various types of operations on behalf of the wireless device 202. FIG. 5 illustrates sample components in an implementation where a wireless device 502 (e.g., that may be similar to the device 204) may provide some or all of the signal processing that needs to be performed on data to be output by a wireless device 504 (e.g., that may be similar to the device 202). Here, the device 502 may send the processed data to the device 504 in the form of waveform data. Consequently, the device 504 may simply provide the received waveform data to an appropriate output device such as a transducer.

In a similar manner as above, the device 502 may include a communication processor 506 that may, for example, receive data via a local area network, a wide area network, or some other communication link. The communication processor 506 may process (e.g., decode) the received data, as necessary, to extract data that are destined for the device 504.

The resulting data are provided to a data processor 508 that may process the data on behalf of the device 504. The data processor 508 may comprise a data decompressor 510 that decompresses the data in the event the data were previously compressed. In addition, the data processor 508 may comprise a processor 512 that may provide signal processing functionality such as, for example, decoding. In some aspects the signal processing also may attempt to improve at least one characteristic represented by the data as taught herein.

In some aspects the processor 512 may provide waveform processing functionality to generate waveform encoded data. For example, in a similar manner as discussed above, the processor 512 may generate pulse code modulated data, sigma delta modulated data, or some other form of waveform encoded data.

A transmitter 514 may then transmit the processed data via an appropriate communication link 516 to the device 504. As discussed above, the data may be transmitted in a substantially unprocessed form. For example, the transmitter 514 may transmit waveform encoded data that have not been compressed.

At the device 504, a receiver 518 processes the data received via the link 516 (e.g., in a similar manner as discussed above). In an implementation where the device 502 provides waveform encoded data, the receiver 518 may output the raw waveform encoded data. A waveform processor 520 may then process the received waveform encoded data, as necessary, and provide that data to an appropriate transducer 522 (e.g., a speaker).

In some aspects waveform processing may be advantageously employed to reduce the amount of processing required and the power consumed by the device 504. For example, the waveform processor 520 and the transducer 522 may comprise a general amplifier, a class-D amplifier, or a direct drive class-D amplifier. Alternatively, in some implementations signal delta data may be passed unprocessed to a general class-D amplifier. One implementation of a direct drive class-D amplifier circuit will be discussed in more detail conjunction with FIGS. 6 and 7.

Figure 6:
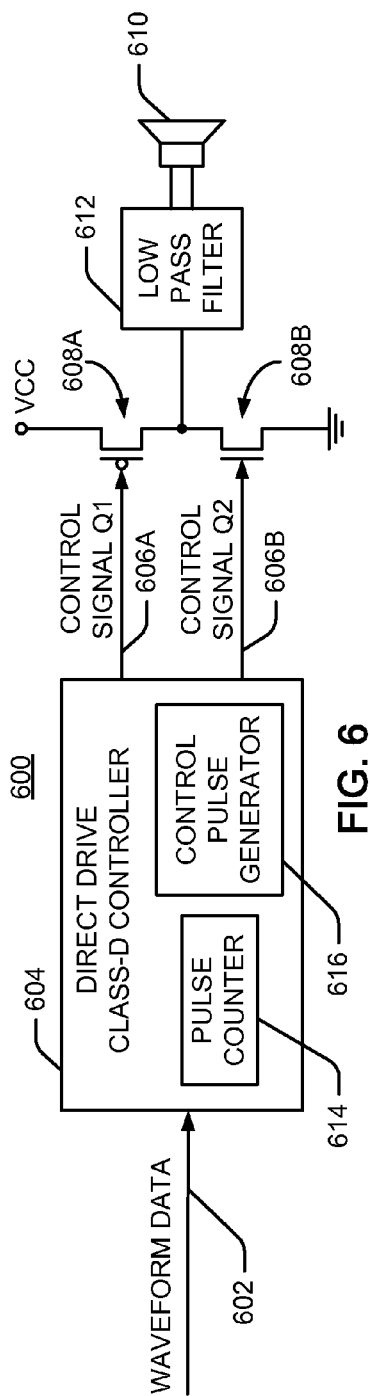
FIG. 6 is a simplified block diagram of several sample aspects of a direct drive class-D circuit.

FIG. 6 illustrates sample aspects of an output transducer circuit 600 that may be directly driven by received waveform data 602 (e.g., sigma delta modulated data). Here, the output transducer circuit 600 comprises a direct drive class-D controller 604 that generates control signals 606A and 606B for controlling a pair of switches 608A and 608B (e.g., transistors) that, in turn, drive an output transducer 610 (e.g., via a low pass filter 612, if necessary). In some aspects the direct drive class-D controller 604 may generate the control signals 606A and 606B based on differences in durations associated with different levels of the waveform data 602. For example, referring to FIG. 7, the generation times and the widths of the control signals Q1 and Q2 (e.g., control signals 606A and 606B) may be based on differences between the widths of successive levels of one and zeros in the sigma delta modulated waveform data S (e.g., waveform data 602). Thus, the received waveform data 602 may directly drive the transducer 610 without being subjected to processing such as signal processing that attempts to improve a characteristic represented by the data or processing that converts the waveform data to analog data. By eliminating this signal processing, a wireless device (e.g., the device 504) may consume less power than a conventional device that does perform such signal processing.

Referring again to FIGS. 6 and 7, additional details of the generation of the control signals 606A and 606B will now be treated. In some implementations the control signals Q1 and Q2 may be generated at intervals associated with sets of successive high-level portions (e.g., having a value of "1") and low-level portions (e.g., having a value of "0") of the waveform data S. The time periods represented by lines W0, W2, and W4 define one example of such sets of successive high-level and low-level portions. The time period W0 includes time periods P0 and P1 where the waveform data S consist of five consecutive high-level pulses followed by three consecutive low-level pulses, respectively. Similarly, the time period W2 includes time periods P2 and P3 where the waveform data S consist of four consecutive high-level pulses and five consecutive low-level pulses, respectively. In addition, the time period W4 includes time periods P4 and P5 where the waveform data S consist of seven consecutive high-level pulses and three consecutive low-level pulses, respectively.

Figure 7:
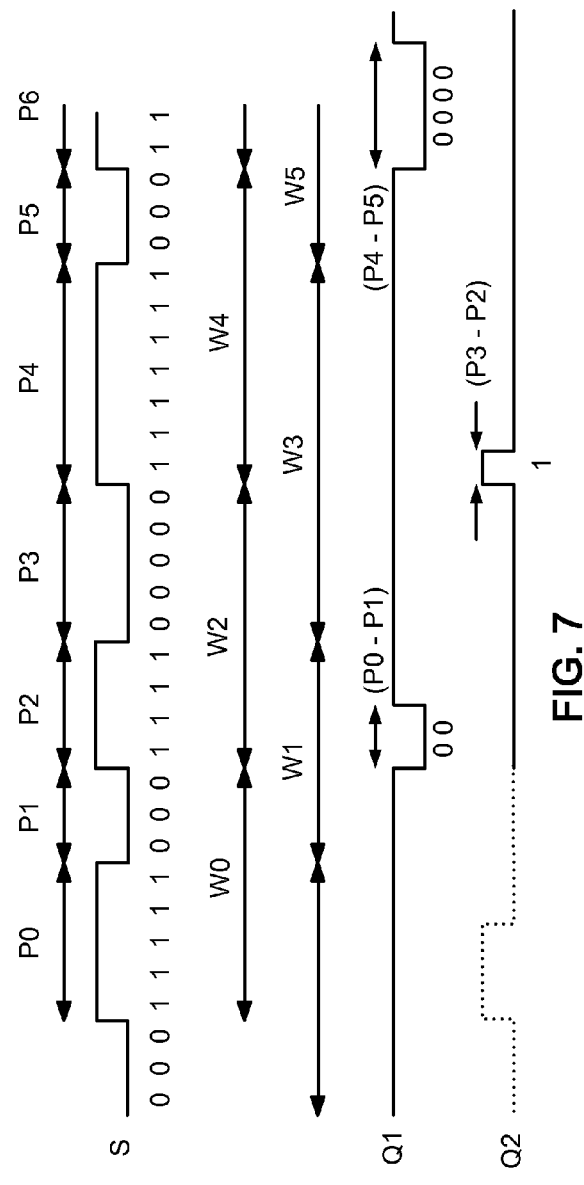
FIG. 7 is a simplified diagram of several sample waveforms that may be associated with the circuit of FIG. 6.

In the example of FIG. 7, the control signals Q1 and Q2 are generated based on the pulses of time periods W0, W2, and W4. In particular, a negative-going pulse may be generated for signal Q1 in the event the number of high-level pulses of a given time period (e.g., time period W0) is greater than the number of low-level pulses of that time period. Conversely, a positive-going pulse may be generated for signal Q2 in the event the number of high-level pulses of a given time period is less than the number of low-level pulses of that time period. Thus, in the example of FIG. 7, a pulse is generated on signal Q1 after the time periods W0 and W4 while a pulse is generated on signal Q2 after time period W2.

In some aspects the widths of the control pulses Q1 and Q2 are based on pulses of the time periods W0, W2, and W4. For example, the width of a control signal may be based on the difference between the number of high-level pulses and low-level pulses within a given time period. Thus, in the example of FIG. 7, the first pulse of control signal Q1 has a width of two pulses because the time period P0 had five high-level pulses and the time period P1 had three low-level pulses. Similarly, the pulse of control signal Q1 following the time period W2 has a width of one pulse because the time period P2 had four high-level pulses and the time period P3 had five low-level pulses.

The above implementation advantageously provides a class-D type output that utilizes tri-state control signals. For example, in the event the durations of successive levels of the waveform data are equal (e.g., representative of silence in an audio signal), both control signals will be off. Thus, the control signals may have a state that turns one switch on, another state that turns the other switch on, and yet another state that does not turn either of the switches on. Through the use of such a tri-state technique, the power consumption of the circuit 600 may be substantially proportional to the volume and activity level of, for example, an audio signal represented by the waveform data 602.

It should be appreciated that the control signals Q1 and Q2 may be generated based on other timing relationships. For example, in some implementations the control signals Q1 and Q2 may be generated based on the sets of pulses associated with time periods W1, W3, W5, and so on. In addition, in some applications the control signals Q1 and Q2 may be generated based on the even time windows (W0, W2, W4, etc.) and the odd time windows (W1, W3, W5, etc.), thereby doubling the number of pulses output on Q1 and Q2. Here, collisions between active Q1 and Q2 pulses may be more frequent; consequently, provisions may be made to ensure that the switches are not turned on simultaneously.

A direct drive class-D amplifier circuit or some other similar circuit that provides functionality similar to that discussed above may be implemented in a variety of ways. For example, in some implementations the controller 604 may comprise a pulse counter 614 that counts the number of pulses associated with each level of the waveform data 602. The resulting count may then be sent to a control pulse generator 616 that generates the control signals 606A and 606B as discussed above. In some implementations an up/down counter may be used to determine the difference in the number of ones and zeros in successive levels of the waveform data 602. In this case, the resulting count value may be passed to another counter that down counts to output a pulse of an appropriate width to thereby generate the control signals 606A and 606B. In some aspects the output stage (e.g., including the switches 608A and 608B and the transducer 610) may instead comprise an H-bridge including two switch pairs where each switch pair is coupled to a unique one of the two input terminals of the transducer 610.

As discussed above, in some implementations the waveform data may comprise multi-bit pulse code modulated data. In this case, the controller 604 may comprise a sigma delta modulation encoder that converts pulse code modulated data into sigma delta modulated data (e.g., the waveform data S of FIG. 7).

The teachings herein may be employed with other types of pulse width modulation schemes. For example, the circuit 600 may be adapted to process waveform data that take more of an analog form (e.g., data that are not quantized in time). Hence, the controller 604 may be adapted to generate the control signals 606A and 606B based on the pulse width of the waveform data 602 rather than pulse counts (e.g., "1s" and "0s").

The waveform data may represent any of various types of information. For example, the waveform data may represent audio signals, various forms of sensed signals, RF signals, or some other suitable information (e.g., as discussed above).

Figure 8:
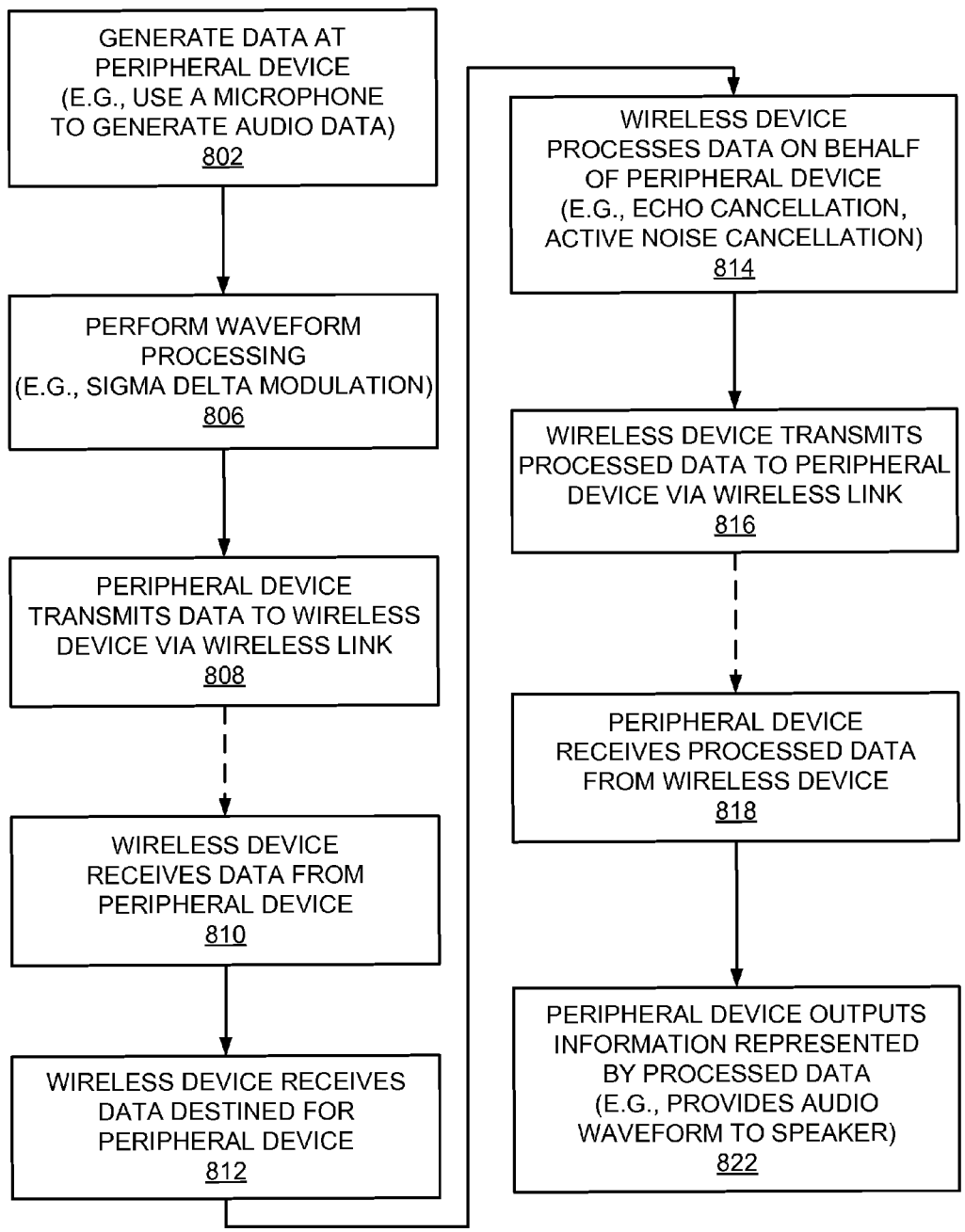
FIG. 8 is a flowchart of several sample aspects of operations that may be performed to provide offloaded processing for data received from a device and then transmitted back to the device.

Referring now to FIG. 8, in some aspects offloaded processing may relate to a scenario where one device receives data from another device, processes that data on behalf of the other device, and then sends the processed data back to the other device. Blocks 802, 806, and 808 of FIG. 8 represent operations that may be performed by device such as the wireless device 202 of FIG. 2A. In some implementations the operations of blocks 802, 806, and 808 may be similar to the operations of blocks 302, 306, and 308 discussed above. Thus, the device 202 may generate or otherwise obtain data, and send the data to another device (e.g., the device 204) for processing. In addition, the device 202 may utilize waveform processing to preprocess the generated data for transmission.

Here, the data sent to the device 204 may be used to generate data that will be sent back to the device 202. For example, in implementations that incorporate echo cancellation the data from a microphone (e.g., a headset microphone) may comprise the raw data that is sent to the device 204 for use in echo cancellation operations. Similarly, in implementations that incorporate active noise cancellation the data from another microphone (e.g., a microphone it senses ambient sound) may be sent to the device 204 to be used in active noise cancellation operations.

Blocks 810, 812, 814, and 816 of FIG. 8 represent operations that may be performed by a device such as the wireless device 204 of FIG. 2A. In some implementations the operations of blocks 810 and 814 may be similar to one or more of the operations of blocks 310, 312, and 314 discussed above. Thus, the device 204 may process the data received from the device 202. In addition, in some implementations the operations of blocks 812 and 814 may be similar to one or more of the operations of blocks 402, 404, and 406 discussed above. Thus, the device 204 may process data destined for the device 202.

In either case, the device 204 may process the data it receives on behalf of the device 202. In addition, the device 204 may perform other processing, as necessary, as discussed herein.

In some implementations an echo canceller 234 of the processor 216 may perform echo cancellation operations on behalf of the device 202. To this end, the echo canceller 234 may process data received from the device 202 as well as data being transmitted to the device 202 to reduce any echo components that may be present in the data.

In some implementations an active noise canceller 236 of the processor 216 may perform active noise cancellation operations on behalf of the device 202. To this end, the active noise canceller may process data to be output by a transducer (e.g., a headset speaker) of the device 202 as well as data generated by an input transducer 206 (e.g., an ambient microphone) of the device 202. In this way, the active noise canceller 236 may add a signal component to the data being sent to the device 202 that will cancel out ambient noise that may otherwise be heard by the user of the device 202.

It should be appreciated that the above are but a few examples of operations the device 204 may perform on behalf of the device 202, and that other operations may be employed in accordance with the teachings herein. After the device 204 completes the processing of the data, the device 204 may send the processed data back to the wireless device 202 via the wireless link (block 816). As discussed above, in some implementations the device 204 may send the waveform encoded data to the device 202 to enable the device 202 to efficiently output the desired data.

Blocks 818 and 822 again represent operations that may be performed by a device such as the wireless device 202. In some implementations the operations of blocks 818 and 822 may be similar to the operations of blocks 410, 412, and 414 discussed above. Thus, the device 202 may process the received data as necessary, and output the data via the output device 232.

As mentioned above, offloaded processing may be implemented in a static manner or in a dynamic manner. Here, a decision as to whether to implement or invoke offloaded processing may be based on one or more of a variety of factors. For example, processing may be offloaded to a "more capable" device that has more processing resources. Such processing resources may include a larger capacity battery, more processing capability (e.g., a faster processor), more efficient processing, and so on. In addition, processing may be offloaded (e.g., at design time) based on criteria such as a desire to keep the cost of a device as low as possible, to reduce the complexity of a device, or to reduce the size of a device (e.g., by reducing the size of the battery and the integrated circuit die). In some aspects processing may be offloaded based on defined classes of devices. For example, the classes may be associated with different processing resources, different price targets, different complexity, and difference sizes. Here, different types of processing may be offloaded to different classes of devices.

In some aspects devices may be dynamically configured, as necessary, to provide offloaded processing. Here, the dynamic offloaded processing may be invoked by operation of one or both the devices involved in the offloaded operation or by some other device. In addition, dynamic offloaded processing may be evoked based on one or more criteria including, for example, a defined class of a given device, the capabilities of a given device, the processing load of a given device, the power consumption or power reserves of a given device, or some other suitable criterion. In some aspects these criteria may be temporally based. For example, a decision as to whether and how to invoke offloaded processing may be based on prior conditions, current conditions, or future (e.g., anticipated) conditions.

Figure 9:
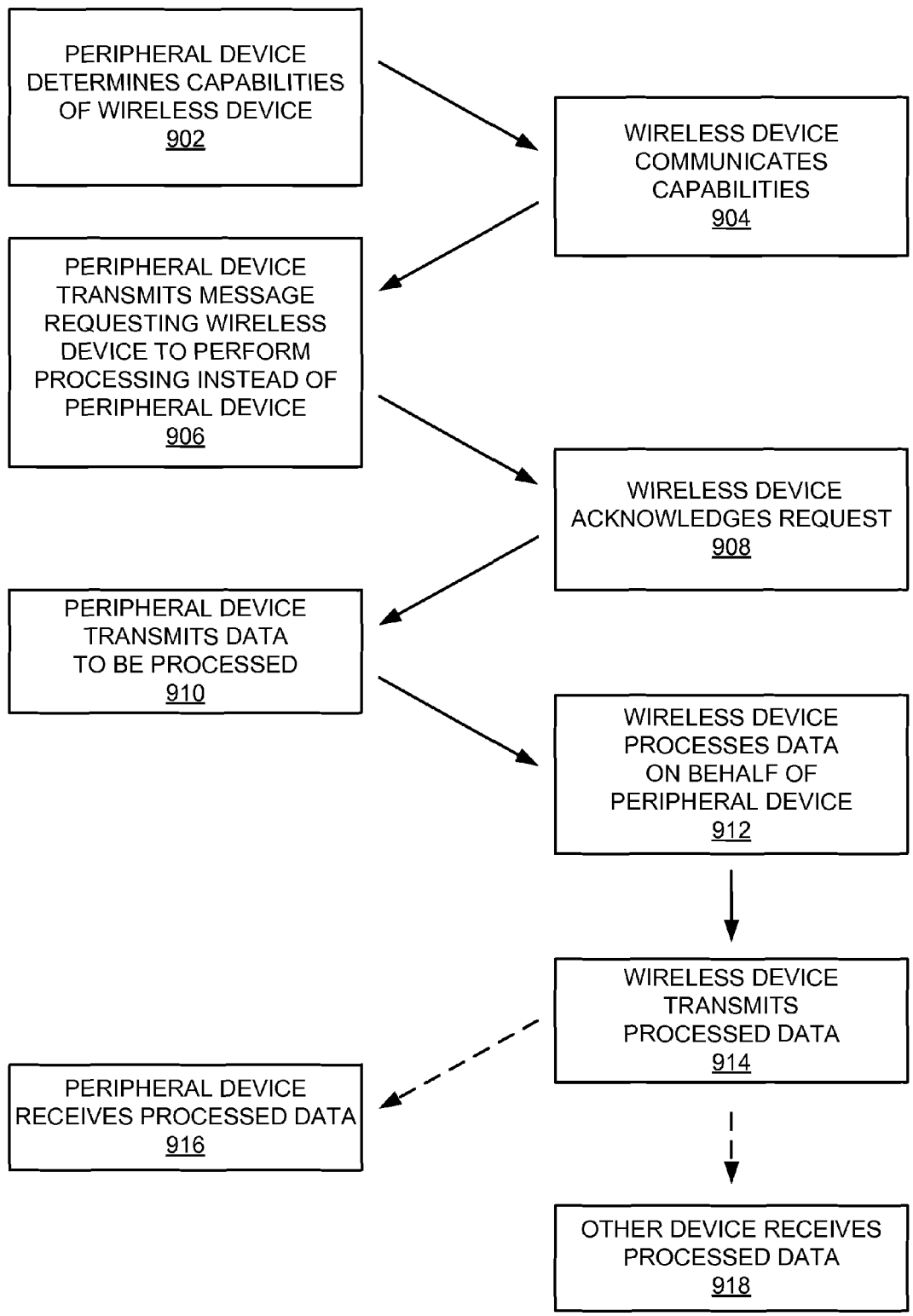
FIG. 9 is a flowchart of several sample operations that may be performed to request offloaded processing.

FIG. 9 illustrates sample operations of an implementation where a peripheral device requests another device to perform processing on its behalf. As represented by blocks 902 and 904, one or more of the devices may determine the capabilities of the other device. In some implementations the devices may communicate with one another to learn the capabilities of a device (e.g., when the devices associate with one another). Alternatively, in some implementations the capabilities of certain types of devices may be provided (e.g., programmed into) a device at some other time (e.g., during manufacture or when a device is initially brought into service).

As represented by block 906, once the peripheral device learns the capabilities of the wireless device, the peripheral device may send a message to the wireless device requesting that the wireless device perform one or more operations at some point in the future. In the event the wireless device agrees to do the requested processing, the wireless device may acknowledge the request from the peripheral device (block 908). Here, a message from one or both the devices may identify which particular operations are to be offloaded and how those operations may be invoked (e.g., the form of a subsequent request).

As represented by block 910, at some later point in time the peripheral device transmits data to the wireless device. As represented by block 912, the wireless device then processes the data on behalf of the peripheral device. This processing may take the form of, for example, the offloaded processing discussed above or as otherwise taught herein.

As represented by block 914, the wireless device then transmits the processed data to the appropriate recipient. As discussed above, the wireless device may transmit the processed data back to the peripheral device (block 916) or to some other device (block 918).

Figure 10:
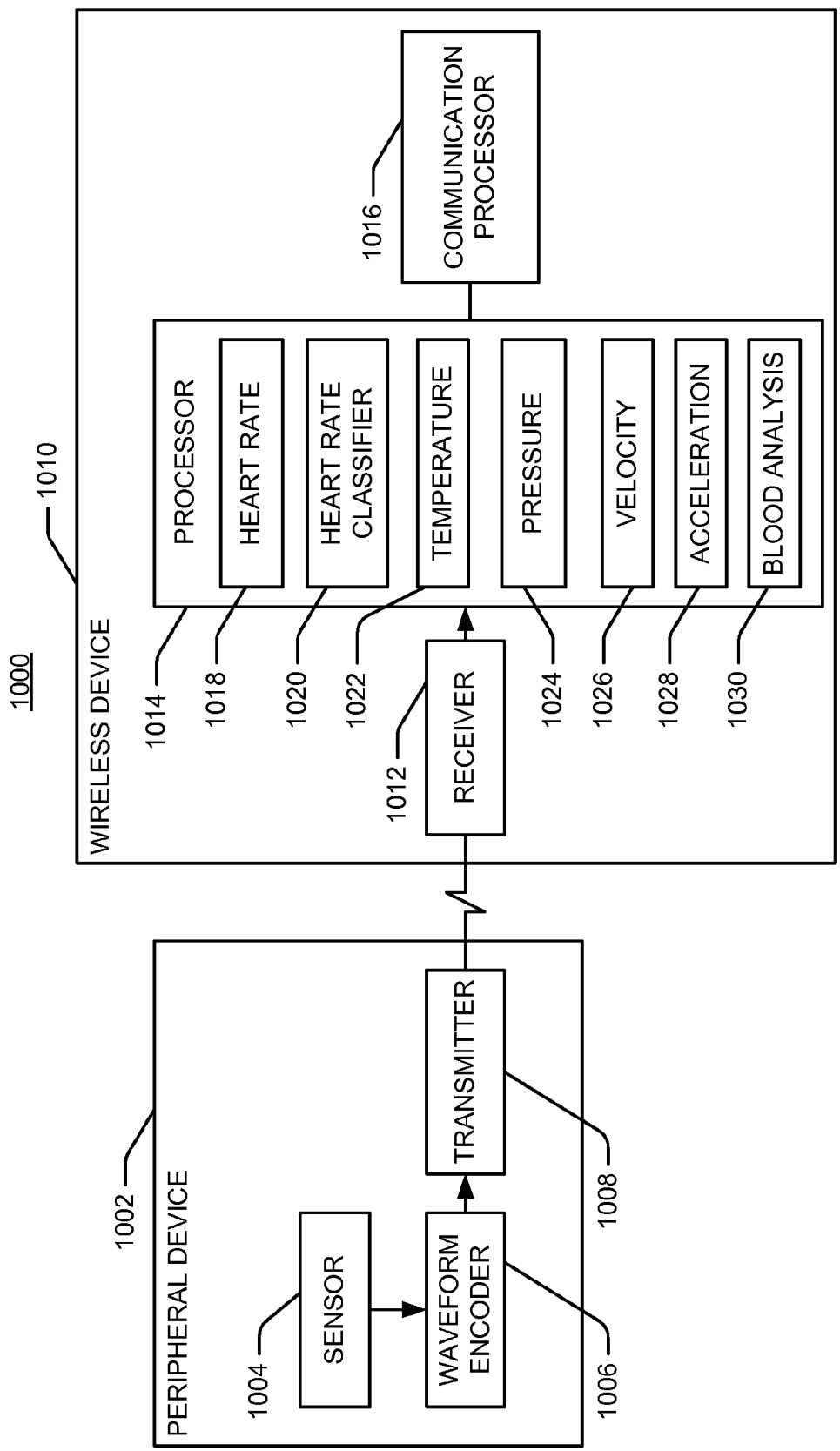
FIG. 10 is a simplified block diagram of several sample aspects of apparatuses adapted to provide offloaded processing for various sensing operations.

The teachings herein may be employed to offload processing for wide variety of operations. For example, FIG. 10 illustrates sample components of a system 1000 adapted to process data that may be sensed from one or more of a variety of sensors.

A peripheral device 1002 includes one or more sensors 1004 for sensing one or more conditions such as ambient conditions (e.g., temperature) or biological conditions (e.g., heart rate, temperature, blood pressure, etc.). The sensor(s) 1004 may take various forms including a chemical transducer, and electrical transducer, a mechanical transducer, a magnetic transducer, a nuclear transducer, or an optical transducer. For example, a chemical transducer may be used to acquire glucose level information from a person. An electrical transducer may be used to detect a person's heartbeat. A mechanical transducer may be used to acquire temperature, pressure, velocity, or acceleration information. An optical transducer may be used to acquire oximetry information. A nuclear transducer may be used to measure radiation types and levels. In addition, the peripheral device 1002 may be carried at an appropriate location on a person's body or located at an appropriate location (e.g., within a vehicle) to sense one or more of these conditions.

The acquired sensor data may be passed as analog or digital waveforms for processing to another wireless device. Thus, as discussed above, the device 1002 may include a waveform encoder 1006 for processing the sensed data for transmission and a transmitter 1008 for transmitting the data to another wireless device 1010.

The wireless device 1010 includes a receiver 1012, a processor 1014, and a communication processor 1016 in a similar manner as discussed above. Here, the processor 1014 may comprise one or more components for processing the sensed data on behalf of the device 1002. For example, a heart rate component 1018 may process sensed EKG data to generate an indication of the current rate of a person's heartbeat. A heart rate classifier 1020 may process the heartbeat rate information to classify the heart rate. A temperature component 1022 may process sensed temperature data (e.g., representative of ambient temperature or body temperature) to generate an indication of a measured temperature. A pressure component 1024 may process sensed pressure data (e.g., representative of a person's blood pressure, ambient pressure, tire pressure, etc.) to generate an indication of pressure. A velocity component 1026 may process sensed velocity data to generate an indication of velocity (e.g., of a person or some other moving object). An acceleration component 1028 may process sensed acceleration data to generate an indication of acceleration (e.g., of a person or some other moving object). A blood analysis component 1030 may process sensed chemical data or oximetry data to generate an indication of a person's glucose level or oxygen concentration level, respectively. The corresponding indication generated by the processor 1014 may then be sent to an appropriate device such as, for example, an output device (e.g., a display device) of the device 1010 or to another device via the communication processor 1016.

In some aspects one or more wireless sensing devices may be deployed for sensing, for example, ambient or biological conditions whereby the sensing devices communicate with one or more other wireless devices via a body area network, a personal area network, or in some other manner. For example, referring to the system 1100 of FIG. 11, a sensing device 1102 may send sensed data to a wireless device 1104 either directly or via another wireless device such as an intermediary device 1106. Sample operations that may be performed by the components of the system 1100 will be discussed in conjunction with the flowchart of FIG. 12.

Figure 12:
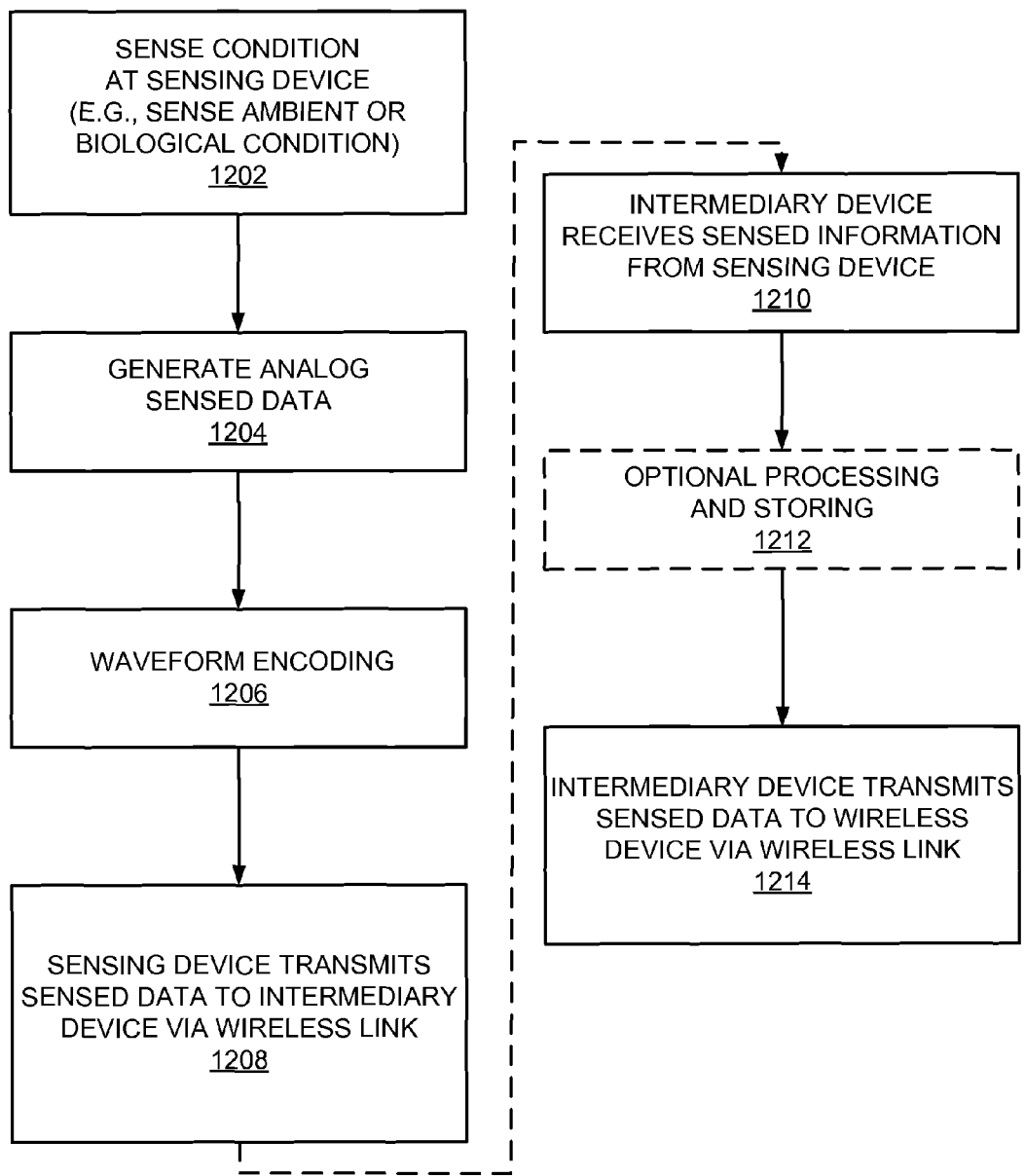
FIG. 12 is a flowchart of several sample operations that may be performed to facilitate offloaded processing using an intermediary device.

As represented by block 1202 in FIG. 12, the sensing device 1102 includes one or more sensors 1108 for sensing various conditions as discussed or taught herein. As represented by block 1204, the sensor(s) 1108 may generate analog sensed data (e.g. captured waveforms) on a continual or repetitive basis. As mentioned above, in a typical implementation the sensed data comprise raw (e.g., unprocessed) analog data.

In some implementations the sensing device 1102 may simply pass the sensed data to another device for processing. As discussed herein, the sensed data may be passed as an analog waveform or as a digital waveform. Accordingly, as represented by block 1206 in some aspects the sensing device 1102 may comprise a waveform encoder 1110 (e.g., a sigma delta encoder) for processing the sensed data for transmission.

Figure 11:
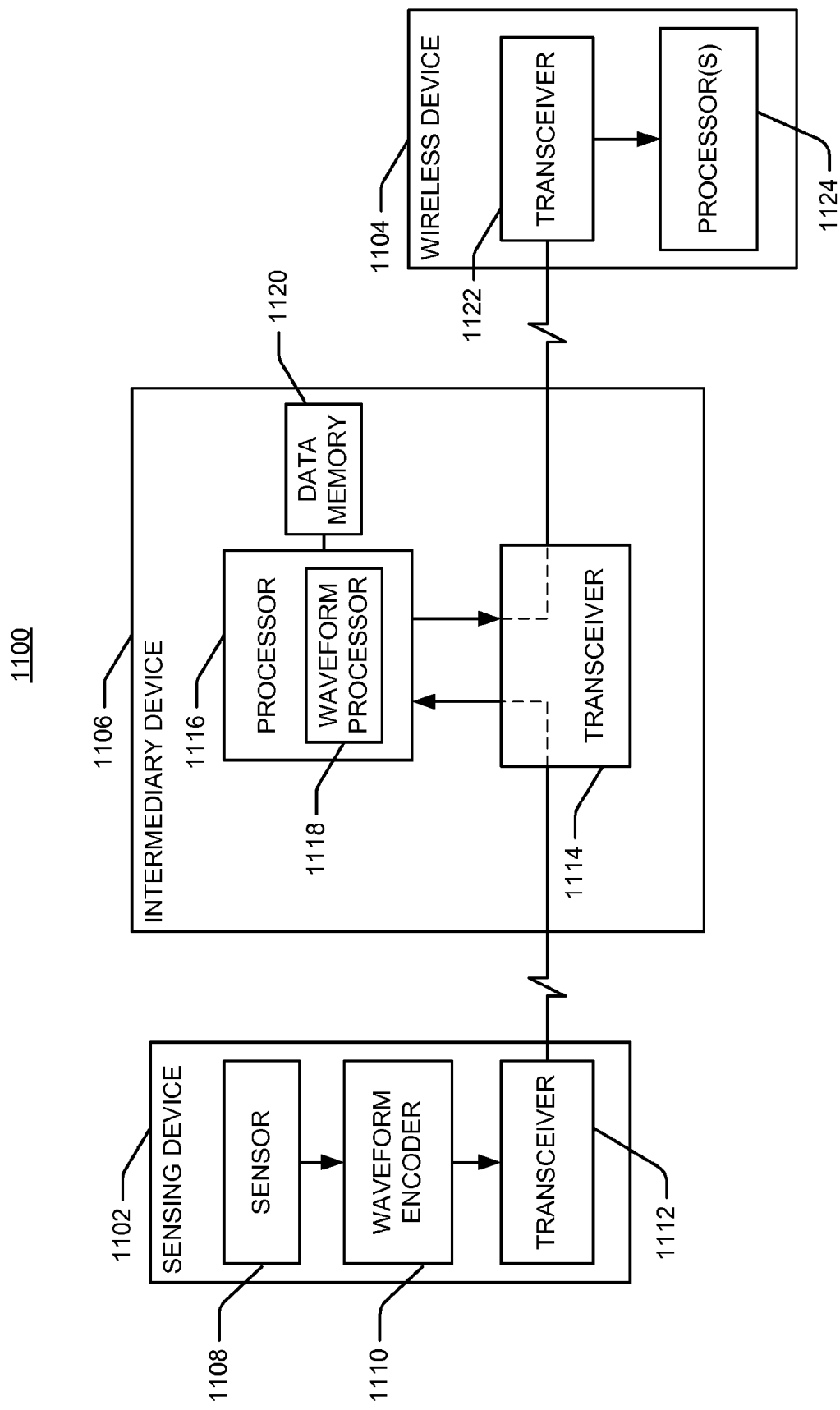
FIG. 11 is a simplified block diagram of several sample aspects of a communication system including an intermediary device to facilitate providing offloaded processing.

As represented by block 1208, the sensing device 1102 includes a transmitter 1112 for transmitting the data to another wireless device via a wireless communication link. As mentioned above, in some implementations the sensing device 1102 may transmit the sensed data to the wireless device 1104 in a direct manner or, as depicted in FIG. 11, via one or more intermediary devices 1106.

The use of one or more intermediary devices may be advantageously employed to increase the reliability of data transmission in the system 1100. For example, data transmission in the system 1100 may be subject to interruptions in wireless connectivity between devices. In addition, different amounts of battery power may be available in various devices of the system 1100 at a given point in time. Accordingly, the system 1100 may employ the intermediary devices 1106 as relay points, for temporarily storing the sensor data for relay to another device (e.g., a wireless device) at a later time, or for offloading one or more processing operations.

Referring again to FIG. 12, as represented by block 1210, the intermediary device 1106 includes a transceiver 1114 for receiving data from the sensing device 1102. As represented by block 1212, the intermediary device 1106 may include a processor component 1116 comprising, for example, a waveform processor 1118, for performing one or more operations as discussed herein. In addition, the peripheral device 1106 may include a data memory 1120 for storing sensed data and other information. As represented by block 1214, the transceiver 1114 transmits the sensed data to another device (e.g., the wireless device 1104) via a wireless communication link.

As discussed herein, once the wireless device 1104 receives the raw or processed sensed data, the wireless device may process the data on behalf of the sensing device 1102 or some other device (e.g., the peripheral device 1106). To this end, the wireless device 1104 also includes a transceiver component 1122 for communicating with the sensing device 1102, the intermediary device 1106, or both. In addition, the wireless device 1104 includes one or more processor components 1124 for processing data and communicating with other devices (e.g., via a wide area network or some other communication link).

In some implementations the sensing device 1102 may comprise a digital signal processor or a microprocessor. Here, the sensing device also may comprise an analog-to-digital converter for converting the sensed data to a digital form.

Figure 13:
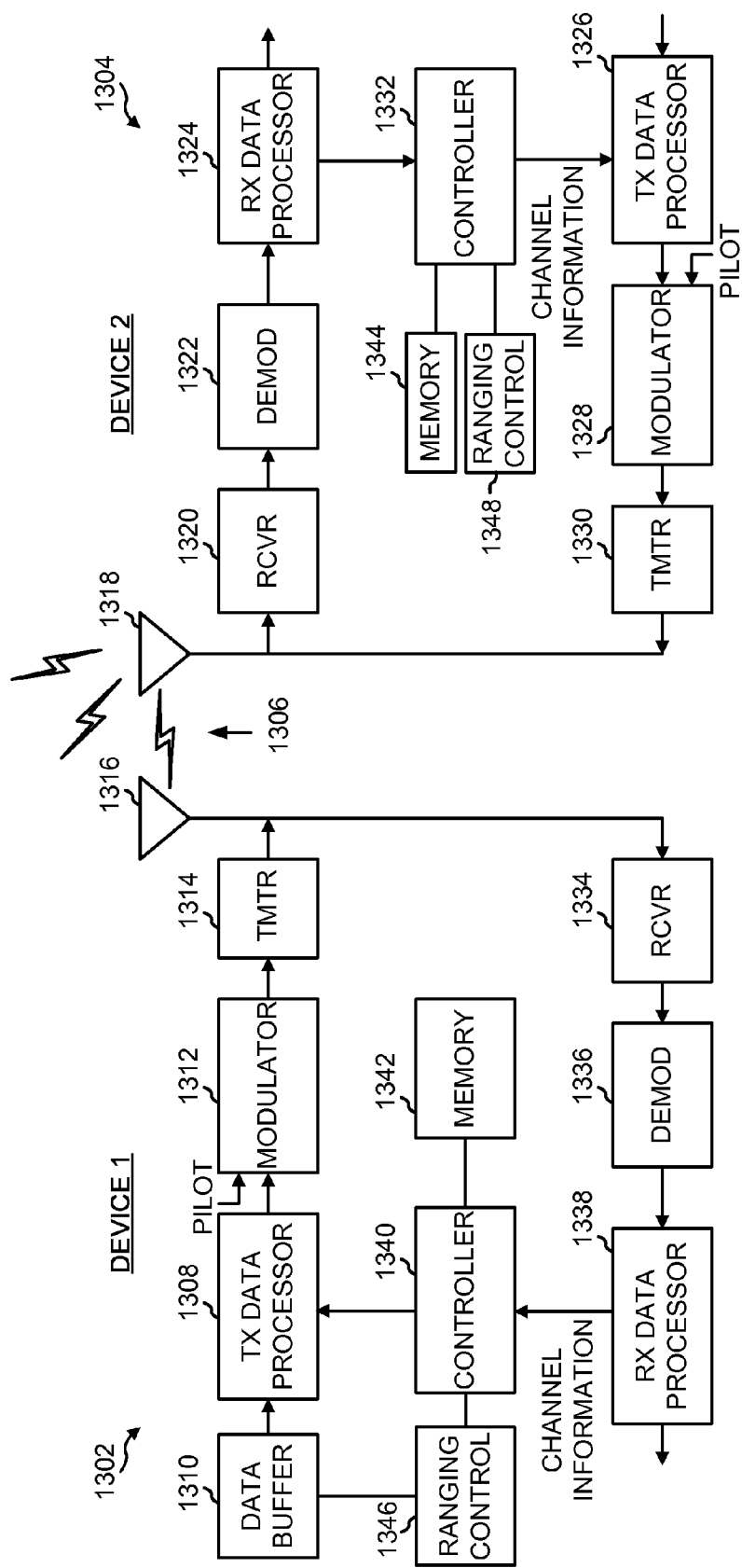
FIG. 13 is a simplified block diagram of several sample aspects of communication components.

The teachings herein may be incorporated into a device employing various components for communicating with at least one other device. FIG. 13 depicts several sample components that may be employed to facilitate communication between devices. Here, a first device (e.g., an access terminal)

1302 and a second device (e.g., an access point) 1304 are adapted to communicate via a communication link 1306 over a suitable medium.

Initially, components involved in sending information from the device 1302 to the device 1304 (e.g., a reverse link) will be treated. A transmit ("TX") data processor 1308 receives traffic data (e.g., data packets) from a data buffer 1310 or some other suitable component. The transmit data processor 1308 processes (e.g., encodes, interleaves, and symbol maps) each data packet based on a selected coding and modulation scheme, and provides data symbols. In general, a data symbol is a modulation symbol for data, and a pilot symbol is a modulation symbol for a pilot (which is known a priori). A modulator 1312 receives the data symbols, pilot symbols, and possibly signaling for the reverse link, and performs modulation (e.g., OFDM or some other suitable modulation) and/or other processing as specified by the system, and provides a stream of output chips. A transmitter ("TMTR") 1314 processes (e.g., converts to analog, filters, amplifies, and frequency upconverts) the output chip stream and generates a modulated signal, which is then transmitted from an antenna 1316.

The modulated signals transmitted by the device 1302 (along with signals from other devices in communication with the device 1304) are received by an antenna 1318 of the device 1304. A receiver ("RCVR") 1320 processes (e.g., conditions and digitizes) the received signal from the antenna 1318 and provides received samples. A demodulator ("DEMOD") 1322 processes (e.g., demodulates and detects) the received samples and provides detected data symbols, which may be a noisy estimate of the data symbols transmitted to the device 1304 by the other device(s). A receive ("RX") data processor 1324 processes (e.g., symbol demaps, deinterleaves, and decodes) the detected data symbols and provides decoded data associated with each transmitting device (e.g., device 1302).

Components involved in sending information from the device 1304 to the device 1302 (e.g., a forward link) will be now be treated. At the device 1304, traffic data are processed by a transmit ("TX") data processor 1326 to generate data symbols. A modulator 1328 receives the data symbols, pilot symbols, and signaling for the forward link, performs modulation (e.g., OFDM or some other suitable modulation) and/or other pertinent processing, and provides an output chip stream, which is further conditioned by a transmitter ("TMTR") 1330 and transmitted from the antenna 1318. In some implementations signaling for the forward link may include power control commands and other information (e.g., relating to a communication channel) generated by a controller 1332 for all devices (e.g. terminals) transmitting on the reverse link to the device 1304.

At the device 1302, the modulated signal transmitted by the device 1304 is received by the antenna 1316, conditioned and digitized by a receiver ("RCVR") 1334, and processed by a demodulator ("DEMOD") 1336 to obtain detected data symbols. A receive ("RX") data processor 1338 processes the detected data symbols and provides decoded data for the device 1302 and the forward link signaling. A controller 1340 receives power control commands and other information to control data transmission and to control transmit power on the reverse link to the device 1304.

The controllers 1340 and 1332 direct various operations of the device 1302 and the device 1304, respectively. For example, a controller may determine an appropriate filter, reporting information about the filter, and decode information using a filter. Data memories 1342 and 1344 may store program codes and data used by the controllers 1340 and 1332, respectively.

FIG. 13 also illustrates that the communication components may include one or more components that perform ranging-related operations as taught herein. For example, a ranging control component 1346 may cooperate with the controller 1340 and/or other components of the device 1302 to send and receive ranging-related signals and information to another device (e.g., device 1304). Similarly, a ranging control component 1348 may cooperate with the controller 1332 and/or other components of the device 1304 to send and receive ranging-related signals and information to another device (e.g., device 1302).

A device as taught herein may support or otherwise use various wireless communication links and wireless network topologies. For example, in some aspects the devices 102 and 104 may comprise or form part of a body area network or a personal area network (e.g., an ultra-wideband network). In addition, in some aspects the devices 102 and 104 may comprise or form part of a local area network or a wide area network. The devices 102 and 104 also may support or otherwise use one or more of a variety of wireless communication protocols or standards including, for example, CDMA, TDMA, FDMA, OFDM, OFDMA, WiMAX, Wi-Fi, and other wireless technologies. Accordingly, the devices 102 and 104 may include appropriate components to establish one or more communication links using various wireless technologies. For example, a device may comprise a wireless transceiver (e.g., a radio) with associated transmitter and receiver components that include various components (e.g., signal generators and signal processors) that facilitate communication over a wireless medium. These components may support a variety of wireless physical layer schemes. For example, the physical layer may utilize some form of CDMA, TDMA, OFDM, OFDMA, or other modulation and multiplexing schemes.

In some aspects a device may communicate via a pulsed-based physical layer. For example, the physical layer may utilize ultra-wideband pulses that have a relatively short length (e.g., on the order of a few nanoseconds) and a relatively wide bandwidth. In some aspects an ultra-wideband system may be defined as a system having a fractional bandwidth on the order of approximately 20% or more and/or having a bandwidth on the order of approximately 500 MHz or more.

It should be appreciated that a device as taught herein may be implemented in a variety of forms. For example, the teachings herein may be incorporated into (e.g., implemented within or performed by) a variety of apparatuses (e.g., devices). For example, one or more aspects taught herein may be incorporated into a phone (e.g., a cellular phone), a personal data assistant ("PDA"), an entertainment device (e.g., a music or video device), a headset (e.g., headphones, an earpiece, etc.), a microphone, a medical device (e.g., a biometric sensor, a heart rate monitor, a pedometer, an EKG device, etc.), a user I/O device (e.g., a watch, a remote control, a light switch, a keyboard, a mouse, etc.), a tire pressure monitor, a computer, a point-of-sale device, an entertainment device, a hearing aid, a set-top box, or any other suitable device.

These devices may have different power and data requirements. In some aspects, the teachings herein may be adapted for use in low power applications (e.g., through the use of a pulse-based signaling scheme and low duty cycle modes) and may support a variety of data rates including relatively high data rates (e.g., through the use of high-bandwidth pulses).

In some aspects a device may comprises an access device (e.g., a Wi-Fi access point) for a communication system. For example, a device may provide connectivity to another network (e.g., a wide area network such as the Internet) via a wired or wireless communication link. Accordingly, a device may enable another device (e.g., a Wi-Fi station) to access the other network. In addition, it should be appreciated that one or more of the devices discussed herein may be portable or, in some cases, relatively non-portable.

A device as taught herein may include various components that perform functions based on data transmitted or received via wireless communication. For example, a headset may include a transducer adapted to provide an audible output based on data received via a receiver or a wireless communication link. In addition, a headset may include a transducer (e.g., a microphone) adapted to generate sensed data to be preprocessed for wireless communication. A watch may include a display adapted to provide a visual output based on data received via a receiver or a wireless communication link. A watch also may include a transducer adapted to generate sensed data (e.g., relating to a biological condition) to be preprocessed for wireless communication. A medical device may include a sensor adapted to generate sensed data to be transmitted via a transmitter or a wireless communication link. In addition, a medical device may include a transducer adapted to generate an output (e.g., a warning signal) based on data received via a receiver or a wireless communication link.

Figure 14A:
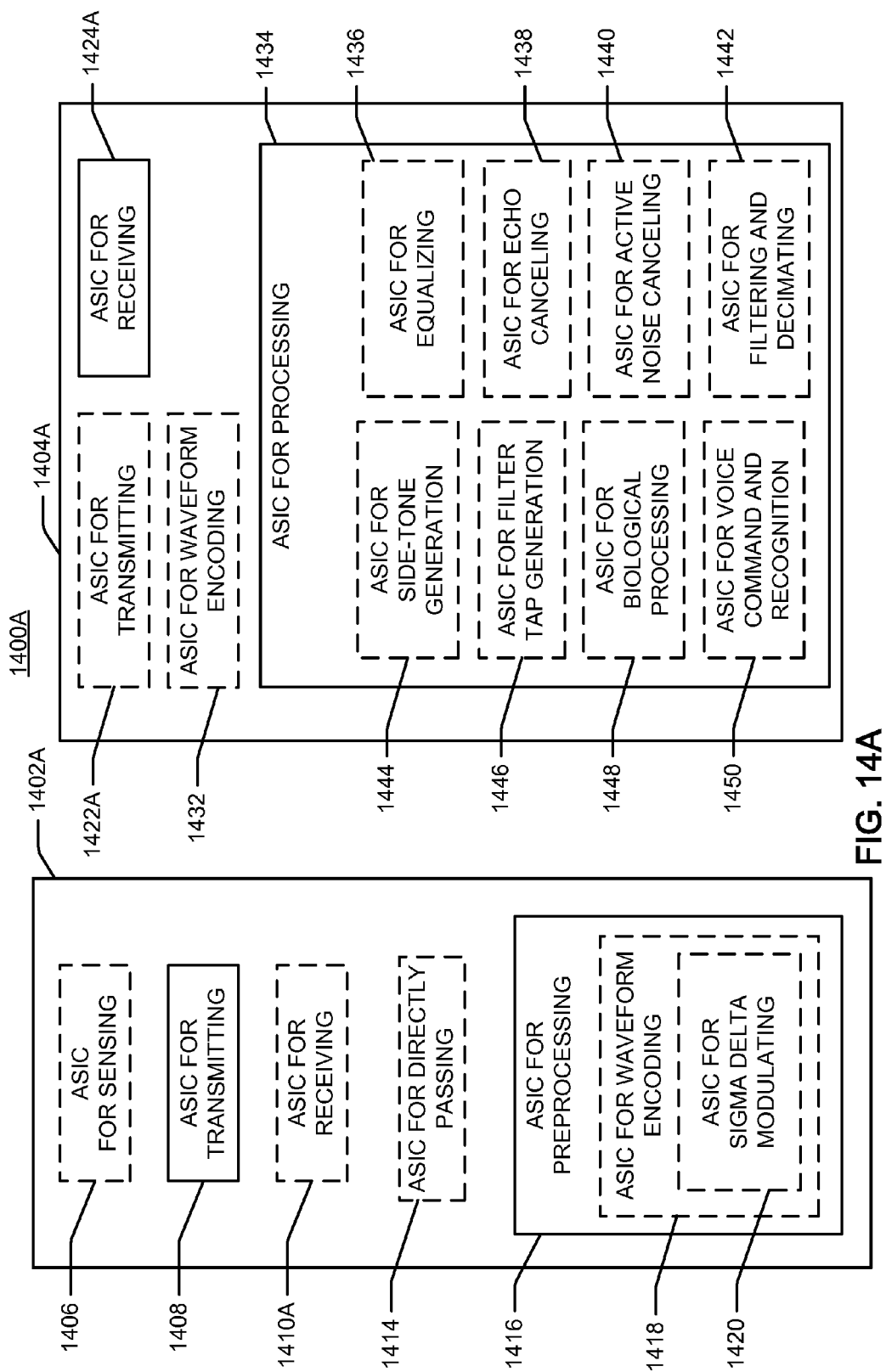
FIGS. 14A and 14B, depicts simplified block diagrams of several sample aspects of apparatuses adapted to provide offloaded processing.
Figure 14B:
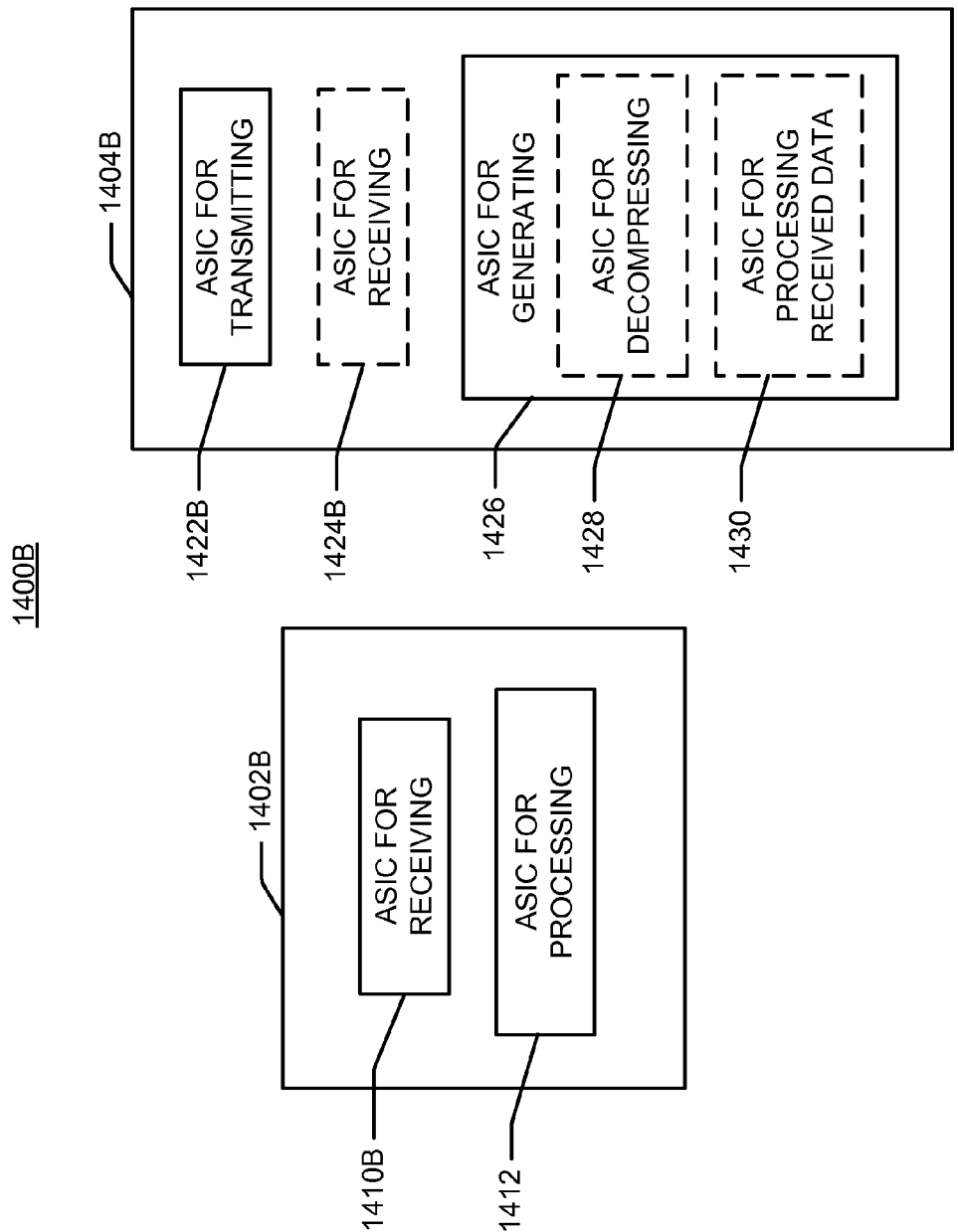

The functional components described or taught herein may be implemented using various structures. Referring to FIGS. 14A and 14B, systems 1400A and 1400B are represented as a series of interrelated functional blocks that may represent functions implemented by, for example, one or more integrated circuits (e.g., an ASIC) or may be implemented in some other manner as taught herein. As discussed herein an integrated circuit may include a processor, software, some combination thereof.

As shown in FIG. 14A, the system 1400A may comprises an apparatus 1402A (e.g., a peripheral device) and an apparatus 1404A (e.g., a wireless device). The apparatus 1402A includes one or more modules 1406, 1408, 1410A, 1414, 1416, 1418, and 1420 that may perform one or more of the functions described above with regard to various figures. For example, an ASIC for sensing 1406 may sense various conditions and may correspond to, for example, component 116 discussed above. An ASIC for transmitting 1408 may provide various functionality relating to transmitting data to another device as taught herein and may correspond to, for example, component 120 discussed above. An ASIC for receiving 1410A may provide various functionality relating to receiving data from another device as taught herein and may correspond to, for example, component 132 discussed above. An ASIC for directly passing 1414 may provide various functionality relating to providing data to an output transducer as taught herein and may correspond to, for example, component 108 and/or component 112 discussed above. An ASIC for preprocessing 1416 may provide various functionality relating to processing signals for transmission as taught herein and may correspond to, for example, component 118 discussed above. An ASIC for waveform encoding 1418 may provide various functionality relating to generating waveform data as taught herein and may correspond to, for example, component 210 discussed above. An ASIC for sigma delta modulating 1420 may provide various functionality relating to generating sigma delta modulated data as taught herein and may correspond to, for example, component 210 discussed above.

The apparatus 1404A also includes one or more modules 1422A, 1424A, 1432, 1434, 1436, 1438, 1440, and 1442 that may perform one or more of the functions described above with regard to various figures. For example, an ASIC for transmitting 1422A may provide various functionality relating to transmitting data to another device as taught herein and may correspond to, for example, component 130 discussed above. An ASIC for receiving 1424A may provide various functionality relating to receiving data from another device as taught herein and may correspond to, for example, component 122 discussed above. An ASIC for waveform encoding 1432 may provide various functionality relating to generating waveform data as taught herein and may correspond to, for example, component 512 discussed above. An ASIC for processing 1434 may perform one or more processing operations as taught herein and may correspond to, for example, component 216 discussed above. An ASIC for equalizing 1436 may perform one or more equalization operations as taught herein and may correspond to, for example, component 218 discussed above. An ASIC for echo canceling 1438 may perform one or more echo cancellation operations as taught herein and may correspond to, for example, component 234 discussed above. An ASIC for active noise canceling 1440 may perform one or more active noise cancellation operations as taught herein and may correspond to, for example, component 236 discussed above. An ASIC for filtering and decimating 1442 may perform one or more filter and decimate operations as taught herein and may correspond to, for example, component to 220 discussed above. An ASIC for side-tone generation 1444 may provide various functionality relating to generating side-tones as taught herein and may correspond to, for example, component 240 discussed above. An ASIC for filter tap generation 1446 may provide various functionality relating to generating filter taps as taught herein and may correspond to, for example, component 238 discussed above. An ASIC for biological processing 1448 may provide various functionality relating to biological (e.g., medical) processing as taught herein and may correspond to, for example, component 242 and/or 1014 discussed above. An ASIC for voice command and recognition 1450 may provide various functionality relating to recognizing voice and commands as taught herein and may correspond to, for example, component 244 discussed above.

As shown in FIG. 14B, the system 1400B may comprises an apparatus 1402B (e.g., a peripheral device) and an apparatus 1404B (e.g., a wireless device). The apparatus 1402B includes one or more modules 1410B and 1412 that may perform one or more of the functions described above with regard to various figures. For example, an ASIC for receiving 1410B may provide various functionality relating to receiving data from another device as taught herein and may correspond to, for example, component 132 discussed above. An ASIC for processing 1412 may perform one or more processing operations as taught herein and may correspond to, for example, component 108 discussed above.

The apparatus 1404A also includes one or more modules 1422B, 1424B, 1426, 1428, and 1430 that may perform one or more of the functions described above with regard to various figures. For example, an ASIC for transmitting 1422B may provide various functionality relating to transmitting data to another device as taught herein and may correspond to, for example, component 130 discussed above. An ASIC for receiving 1424B may provide various functionality relating to receiving data from another device as taught herein and may correspond to, for example, component 122 discussed above. An ASIC for generating 1426 may perform one or more operations relating to generating waveform data as taught herein and may correspond to, for example, component 508 discussed above. An ASIC for decompressing 1428 may perform one or more operations relating to decompressing data as taught herein and may correspond to, for example, component 510 discussed above. An ASIC for processing received data 1430 may perform one or more processing operations as taught herein and may correspond to, for example, component 512 discussed above.

As noted above, in some aspects these components may be implemented via appropriate processor components. These processor components may in some aspects be implemented, at least in part, using structure as taught herein. In some aspects a processor may be adapted to implement a portion or all of the functionality of one or more of these components. In some aspects one or more of the components represented by dashed boxes are optional.

In some aspects the apparatus 1402 and the apparatus 1404 may comprise one or more integrated circuits that provide the functionality of the components illustrated in FIG. 14. For example, in some aspects a single integrated circuit may implement the functionality of the illustrated processor components, while in other aspects more than one processor may implement the functionality of the illustrated components, while in other aspects more than one integrated circuit may implement the functionality of the illustrated processor components.

In addition, the components and functions represented by FIG. 14, as well as other components and functions described herein, may be implemented using any suitable means. Such means also may be implemented, at least in part, using corresponding structure as taught herein. For example, in some aspects means for sensing may comprise a transducer, means for transmitting may comprise a transmitter, means for receiving may comprise a receiver, means for processing may comprise a processor, means for directly passing may comprise a processor and/or receiver, means for preprocessing may comprise a processor, means for waveform encoding may comprise a waveform encoder, means for sigma delta modulating may comprise a waveform encoder, means for generating may comprise a processor, means for decompressing may comprise a decompressor, means for processing received data may comprise a processor, means for processing to extract may comprise a processor, means for equalizing may comprise an equalizer, means for echo canceling may comprise an echo canceller, means for active noise canceling may comprise an active noise canceller, means for filtering and decimating may comprise a filter and decimator, means for side-tone generation may comprise a side-tone processor, means for filter tap generation may comprise a filter tap computation processor, and means for voice recognition may comprise a voice command and recognition processor. One or more of such means also may be implemented in accordance with one or more of the processor components of FIG. 14.

Those of skill in the art would understand that information and signals (e.g., referred to herein as data) may be represented using any of a variety of different technologies and techniques. For example, analog data, digital data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that any of the various illustrative logical blocks, modules, processors, means, circuits, and algorithm steps described in connection with the aspects disclosed herein may be implemented as electronic hardware (e.g., a digital implementation, an analog implementation, or a combination of the two, which may be designed using source coding or some other technique), various forms of program or design code incorporating instructions (which may be referred to herein, for convenience, as "software" or a "software module"), or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is understood that any specific order or hierarchy of steps in any disclosed process is an example of a sample approach. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (e.g., code) from and write information to the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer)

relating to one or more of the aspects of the disclosure. In some aspects a computer program product may comprise packaging materials.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the disclosure. Thus, the present disclosure is not intended to be limited to the aspects shown herein but is to be accorded the widest scope consistent with the principles and novel features disclosed herein.

What is claimed is:

1. A method of processing data, comprising:
   receiving a request, at a first device, for information related to a capability of the first device from a second device;
   transmitting a response to the information request to the second device, wherein the response comprises information related to the capability of the first device;
   receiving a processing offloading request, at the first device, to perform a specified processing of data from the second device;
   determining, at the first device, whether to perform the specified processing in response to the processing offloading request based on a current charge of a battery of the first device; and
   if it is determined to perform the specified processing, perform the following:
      transmitting an acknowledgement to the second device indicating an agreement to perform the specified processing;
      receiving data at the first device, wherein the received data were generated at the second device by preprocessing analog data for wireless transmission; and
      processing the received data at the first device to improve at least one characteristic represented by the analog data.

2. The method of claim 1, wherein the at least one characteristic comprises multimedia, heart rate, temperature, pressure, velocity, or acceleration.

3. The method of claim 1, wherein the at least one characteristic comprises an indication relating to multimedia, heart rate, temperature, pressure, velocity, or acceleration.

4. The method of claim 1, wherein the improving comprises providing data having, as compared to the analog data, less degradation of the at least one characteristic.

5. The method of claim 4, wherein the degradation relates to noise, interference, or noise and interference.

6. The method of claim 1, wherein the specified processing comprises substantially reconstructing, from the received data, data representative of the analog data.

7. The method of claim 1, wherein the specified processing improves at least one attribute of the at least one characteristic.

8. The method of claim 7, wherein the at least one attribute comprises at least one of the group consisting of: frequency response, signal-to-noise ratio, and accuracy.

9. The method of claim 1, wherein the specified processing comprises equalization, echo cancellation, active noise cancellation, filter and decimate operations, filter tap computation, side-tone processing, or voice recognition.

10. The method of claim 1, wherein the specified processing comprises determining a heart rate, classifying a heart rate, determining a temperature, determining a pressure, determining a velocity, or determining an acceleration.

11. The method of claim 1, wherein the analog data comprise raw analog data output by a sensor of the second device.

12. The method of claim 1, wherein the analog data comprise an analog waveform.

13. The method of claim 1, wherein the preprocessing comprises at least one of the group consisting of: error coding, scrambling, interleaving, and formatting.

14. The method of claim 1, wherein the received data comprise waveform encoded data.

15. The method of claim 1, wherein the received data comprise sigma delta modulated data.

16. The method of claim 15, wherein the specified processing further comprises converting the sigma delta modulated data to pulse code modulated data.

17. The method of claim 1, further comprising transmitting the processed data from the first device to the second device.

18. The method of claim 1, further comprising:
   waveform encoding the processed data; and
   transmitting the waveform encoded data from the first device to the second device.

19. The method of claim 1, wherein the data are received via a wireless personal area network air interface or a wireless body area network air interface.

20. The method of claim 1, wherein the data are received via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

21. The method of claim 1, wherein the analog data are generated by a chemical transducer, an electrical transducer, a mechanical transducer, a magnetic transducer, a nuclear transducer, or an optical transducer.

22. The method of claim 1, wherein the processing offloading request specifies a time at which the specified processing of the data is to be performed, and further wherein processing the received data is based on the specified time.

23. The method of claim 1, further comprising transmitting the processed data to a third device.

24. The method of claim 1, further comprising:
   deriving user-perceptible information, at the first device, based on the analog data; and
   providing an indication of the user-perceptible information to a user.

25. The method of claim 1, wherein the information related to the capability of the first device comprises a characteristic of a processor in the first device.

26. The method of claim 25, wherein the characteristic comprises processing speed or efficiency of the processor.

27. The method of claim 1, wherein the information related to the capability of the first device comprises a characteristic of the battery of the first device.

28. An apparatus for processing data, comprising:
   a receiver adapted to:
      receive a request for information related to a capability of the apparatus from a device;
      receive a processing offloading request to perform a specified processing of data from the device; and
      receive data in response to a positive response to the processing offloading request, wherein the received data were generated at the device by preprocessing analog data for wireless transmission;
   a processor adapted to:
      determine whether to perform the specified processing in response to the processing offloading request based on a current charge of a battery of the apparatus; and
      process the received data to improve at least one characteristic represented by the analog data if the processor determined to process the data; and a transmitter adapted to:
  transmit a response to the information request to the device, wherein the response comprises information related to the capability of the apparatus; and
  transmit the positive response or a negative response to the processing offloading request based on the determination performed by the processor.

29. The apparatus of claim 28, wherein the at least one characteristic comprises multimedia, heart rate, temperature, pressure, velocity, or acceleration.

30. The apparatus of claim 28, wherein the at least one characteristic comprises an indication relating to multimedia, heart rate, temperature, pressure, velocity, or acceleration.

31. The apparatus of claim 28, wherein the processor is further adapted to provide data having, as compared to the analog data, less degradation of the at least one characteristic.

32. The apparatus of claim 31, wherein the degradation relates to noise, interference, or noise and interference.

33. The apparatus of claim 28, wherein the processor is further adapted to substantially reconstruct, from the received data, data representative of the analog data.

34. The apparatus of claim 28, wherein the processor is further adapted to improve at least one attribute of the at least one characteristic.

35. The apparatus of claim 34, wherein the at least one attribute comprises at least one of the group consisting of: frequency response, signal-to-noise ratio, and accuracy.

36. The apparatus of claim 28, wherein the processor comprises an equalizer, an echo canceller, an active noise canceller, a filter and decimator, a filter tap computation processor, a side-tone processor, or a voice recognition processor.

37. The apparatus of claim 28, wherein the processor is further adapted to determine a heart rate, classify a heart rate, determine a temperature, determine a pressure, determine a velocity, or determine an acceleration.

38. The apparatus of claim 28, wherein the analog data comprise raw analog data output by a sensor of the device.

39. The apparatus of claim 28, wherein the analog data comprise an analog waveform.

40. The apparatus of claim 28, wherein the preprocessing comprises at least one of the group consisting of: error coding, scrambling, interleaving, and formatting.

41. The apparatus of claim 28, wherein the received data comprise waveform encoded data.

42. The apparatus of claim 28, wherein the received data comprise sigma delta modulated data.

43. The apparatus of claim 42, wherein the processor comprises a filter and decimator adapted to convert the sigma delta modulated data to pulse code modulated data.

44. The apparatus of claim 28, wherein the transmitter is adapted to transmit the processed data to the device.

45. The apparatus of claim 28, further comprising:
  a waveform encoder adapted to waveform encode the processed data; and
  wherein the transmitter is adapted to transmit the waveform encoded data to the device.

46. The apparatus of claim 28, wherein the data are received via a wireless personal area network air interface or a wireless body area network air interface.

47. The apparatus of claim 28, wherein the data are received via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

48. The apparatus of claim 28, wherein the analog data are generated by a chemical transducer, an electrical transducer, a mechanical transducer, a magnetic transducer, a nuclear transducer, or an optical transducer.

49. An apparatus for processing data, comprising:
  means for receiving a processing offloading request to perform a specified processing of data from a device, wherein said means for receiving is adapted to receive data in response to a positive response to the processing offloading request, wherein the received data were generated at the device by preprocessing analog data for wireless transmission, and wherein the means for receiving is further adapted to receive a request for information related to a capability of the apparatus from the device;
  means for processing the request to determine whether to perform the specified processing based on a current charge of a battery of the apparatus, wherein said processing means is adapted to process the received data to improve at least one characteristic represented by the analog data; and
  means for transmitting the positive response or a negative response to the processing offloading request based on the determination performed by the processing means, wherein the means for transmitting is further adapted to transmit a response to the information request to the device, and wherein the response comprises information related to the capability of the apparatus.

50. The apparatus of claim 49, wherein the at least one characteristic comprises multimedia, heart rate, temperature, pressure, velocity, or acceleration.

51. The apparatus of claim 49, wherein the at least one characteristic comprises an indication relating to multimedia, heart rate, temperature, pressure, velocity, or acceleration.

52. The apparatus of claim 49, wherein the improving comprises providing data having, as compared to the analog data, less degradation of the at least one characteristic.

53. The apparatus of claim 52, wherein the degradation relates to noise, interference, or noise and interference.

54. The apparatus of claim 49, wherein the means for processing substantially reconstructs, from the received data, data representative of the analog data.

55. The apparatus of claim 49, wherein the means for processing improves at least one attribute of the at least one characteristic.

56. The apparatus of claim 55, wherein the at least one attribute comprises at least one of the group consisting of: frequency response, signal-to-noise ratio, and accuracy.

57. The apparatus of claim 49, wherein the means for processing comprises means for equalizing, means for echo canceling, means for active noise canceling, means for filtering and decimating, means for filter tap computation, means for side-tone processing, or means for voice recognition.

58. The apparatus of claim 49, wherein the means for processing determines a heart rate, classifies a heart rate, determines a temperature, determines a pressure, determines a velocity, or determines an acceleration.

59. The apparatus of claim 49, wherein the analog data comprise raw analog data output by a sensor of the device.

60. The apparatus of claim 49, wherein the analog data comprise an analog waveform.

61. The apparatus of claim 49, wherein the preprocessing comprises at least one of the group consisting of: error coding, scrambling, interleaving, and formatting.

62. The apparatus of claim 49, wherein the received data comprise waveform encoded data.

63. The apparatus of claim 49, wherein the received data comprise sigma delta modulated data.

64. The apparatus of claim 63, wherein the means for processing comprises means for filtering and decimating to convert the sigma delta modulated data to pulse code modulated data.

65. The apparatus of claim 49, wherein said means for transmitting is adapted to transmit the processed data to the device.

66. The apparatus of claim 49, further comprising:
means for waveform encoding the processed data; and
wherein said means for transmitting is adapted to transmit the waveform encoded data to the device.

67. The apparatus of claim 49, wherein the data are received via a wireless personal area network air interface or a wireless body area network air interface.

68. The apparatus of claim 49, wherein the data are received via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

69. The apparatus of claim 49, wherein the analog data are generated by a chemical transducer, an electrical transducer, a mechanical transducer, a magnetic transducer, a nuclear transducer, or an optical transducer.

70. A computer-program product for processing data, comprising:
a non-transitory computer-readable medium comprising codes executable by at least one computer to:
receive a request, at a first device, for information related to a capability of the first device from a second device;
transmit a response to the information request to the second device, wherein the response comprises information related to the capability of the first device;
receive a processing offloading request, at the first device, to perform a specified processing of data from the second device;
determine, at the first device, whether to perform the specified processing in response to the processing offloading request based on a current charge of a battery of the first device; and
if it is determined to perform the specified processing, perform the following:
transmit an acknowledgement to the second device indicating an agreement to perform the specified processing;
receive data at the first device, wherein the received data were generated at the second device by preprocessing analog data for wireless transmission; and
process the received data at the first device to improve at least one characteristic represented by the analog data.

71. A headset for processing data, comprising:
a receiver adapted to:
receive a request for information related to a capability of the headset from a device;
receive a processing offloading request to perform a specified processing of data from the device; and
receive data in response to a positive response to the processing offloading request, wherein the received data were generated at the device by preprocessing analog data for wireless transmission;
a processor adapted to:
determine whether to perform the specified processing in response to the processing offloading request based on a current charge of a battery of the headset; and
process the received data to improve at least one characteristic represented by the analog data if the processor determined to process the data;
a transmitter adapted to:
transmit a response to the information request to the device, wherein the response comprises information related to the capability of the headset; and
transmit the positive response or a negative response to the processing offloading request based on the determination performed by the processor; and
a transducer adapted to provide an audible output based on the processed data.

72. A watch for processing data, comprising:
a receiver adapted to:
receive a request for information related to a capability of the watch from a device;
receive a processing offloading request to perform a specified processing of data from the device; and
receive data in response to a positive response to the processing offloading request, wherein the received data were generated at the device by preprocessing analog data for wireless transmission;
a processor adapted to:
determine whether to perform the specified processing in response to the processing offloading request based on a current charge of a battery of the watch; and
process the received data to improve at least one characteristic represented by the analog data if the processor determined to process the data;
a transmitter adapted to:
transmit a response to the information request to the device, wherein the response comprises information related to the capability of the watch; and
transmit the positive response or a negative response to the processing offloading request based on the determination performed by the processor; and
a display adapted to provide a visual output based on the processed data.

73. A medical device for processing data, comprising:
a receiver adapted to:
receive a request for information related to a capability of the medical device from a device;
receive a processing offloading request to perform a specified processing of data from the device; and
receive data in response to a positive response to the processing offloading request, wherein the received data were generated at the device by preprocessing analog data for wireless transmission;
a processor adapted to:
determine whether to perform the specified processing in response to the processing offloading request based on a current charge of a battery of the medical device; and
process the received data to improve at least one characteristic represented by the analog data if the processor determined to process the data;
a transmitter adapted to:
transmit a response to the information request to the device, wherein the response comprises information related to the capability of the medical device; and
transmit the positive response or a negative response to the processing offloading request based on the determination performed by the processor; and
a transducer adapted to generate an output based on the processed data.

74. A method of processing data, comprising:
- transmitting, at a first device, a request to a second device for information related to a capability of the second device;
- receiving, at the first device, a response to the information request indicating the capability of the second device;
- determining whether to send a processing offloading request to the second device based on the capability of the second device;
- in response to determining to send the processing offloading request to the second device, perform the following:
  - transmitting the processing offloading request to the second device to perform a specified processing of analog data; and
  - receiving, at the first device, a response to the processing offloading request; and
  - if the response indicates that the second device agrees to perform the specified processing of the analog data, preprocessing the analog data at the first device for wireless transmission, and transmitting the preprocessed data to the second device that is adapted to perform the specified processing of the preprocessed data to improve at least one characteristic represented by the analog data.

75. The method of claim 74, wherein the preprocessing comprises waveform encoding.

76. The method of claim 74, wherein the preprocessing comprises sigma delta modulation encoding.

77. The method of claim 74, wherein the preprocessed data comprise data to be converted into pulse code modulated data.

78. The method of claim 74, wherein the preprocessed data comprise data to be equalized, data to be subjected to echo cancellation, data to be subjected to active noise cancellation, data to be filtered and decimated, data to be subjected to filter tap computation, data to be subjected to side-tone processing, or data to be subjected to voice recognition processing.

79. The method of claim 74, wherein the preprocessed data comprise data to be processed to determine heart rate, classify heart rate, determine temperature, determine pressure, determine velocity, or determine acceleration.

80. The method of claim 74, wherein the preprocessing comprises at least one of the group consisting of: error coding, scrambling, interleaving, and formatting.

81. The method of claim 74, wherein the analog data comprise raw analog data output by a sensor of the first device.

82. The method of claim 74, wherein the analog data comprise an analog waveform.

83. The method of claim 74, wherein the analog data are generated by a chemical transducer, an electrical transducer, a mechanical transducer, a magnetic transducer, a nuclear transducer, or an optical transducer.

84. The method of claim 74, wherein the at least one characteristic comprises multimedia, heart rate, temperature, pressure, velocity, or acceleration.

85. The method of claim 74, wherein the at least one characteristic comprises an indication relating to multimedia, heart rate, temperature, pressure, velocity, or acceleration.

86. The method of claim 74, further comprising receiving, at the first device, processed data derived as a result of the processing by the second device.

87. The method of claim 86, wherein the processed data received from the second device have been processed to improve at least one attribute of the at least one characteristic.

88. The method of claim 87, wherein the at least one attribute comprises at least one of the group consisting of: frequency response, signal-to-noise ratio, and accuracy.

89. The method of claim 86, wherein the processed data received from the second device were subjected to equalization, echo cancellation or active noise cancellation.

90. The method of claim 86, wherein, as compared to the analog data, the processed data received from the second device have less degradation of the at least one characteristic.

91. The method of claim 90 wherein the degradation relates to noise, interference, or noise and interference.

92. The method of claim 86, wherein the processed data received from the second device comprise waveform encoded data.

93. The method of claim 86, further comprising directly passing the processed data received from the second device to a transducer that generates an output based on the processed data.

94. The method of claim 74, wherein the preprocessed data are transmitted via a wireless personal area network air interface or a wireless body area network air interface.

95. The method of claim 74, wherein the preprocessed data are transmitted via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

96. The method of claim 74, wherein the processing offloading request specifies a time at which the processing of the preprocessed data is to be performed.

97. The method of claim 96, wherein the preprocessed data is transmitted to the second device at or before the specified time.

98. The method of claim 74, further comprising selecting an operation among a plurality of operations based on the response to the information request, wherein the processing offloading request instructs the second device to perform the specified processing of the preprocessed data based on the selected operation.

99. The method of claim 74, wherein the information related to the capability of the second device comprises a characteristic of a processor in the second device.

100. The method of claim 99, wherein the characteristic comprises processing speed or efficiency of the processor.

101. The method of claim 74, wherein the information related to the capability of the second device comprises a characteristic of a battery in the second device.

102. An apparatus for processing data, comprising:
- a transmitter adapted to:
  - transmit a request to a device for information related to a capability of the device; and
  - transmit a processing offloading request to the device to perform a specified processing of analog data based on a response to the information request received from the device;
- a receiver adapted to receive a positive response or a negative response to the processing offloading request; and
- a processor adapted to preprocess the analog data for wireless transmission in response to the positive response to the processing offloading request;
- wherein the transmitter is further adapted to transmit the preprocessed data to the device in response to the positive response to the processing offloading request, wherein the device is adapted to perform the specified processing of the preprocessed data to improve at least one characteristic represented by the analog data.

103. The apparatus of claim 102, wherein the processor comprises a waveform encoder adapted to waveform encode the analog data for wireless transmission.

104. The apparatus of claim 102, wherein the processor comprises a sigma delta modulation encoder adapted to sigma delta modulation encode the analog data for wireless transmission.

105. The apparatus of claim 102, wherein the preprocessed data comprise data to be converted into pulse code modulated data.

106. The apparatus of claim 102, wherein the preprocessed data comprise data to be equalized, data to be subjected to echo cancellation, data to be subjected to active noise cancellation, data to be filtered and decimated, data to be subjected to filter tap computation, data to be subjected to side-tone processing, or data to be subjected to voice recognition processing.

107. The apparatus of claim 102, wherein the preprocessed data comprise data to be processed to determine heart rate, classify heart rate, determine temperature, determine pressure, determine velocity, or determine acceleration.

108. The apparatus of claim 102, wherein the preprocessing comprises at least one of the group consisting of: error coding, scrambling, interleaving, and formatting.

109. The apparatus of claim 102, further comprising a sensor, wherein the analog data comprise raw analog data output by the sensor.

110. The apparatus of claim 102, wherein the analog data comprise an analog waveform.

111. The apparatus of claim 102, further comprising a chemical transducer, an electrical transducer, a mechanical transducer, a magnetic transducer, a nuclear transducer, or an optical transducer, adapted generate the analog data.

112. The apparatus of claim 102, wherein the at least one characteristic comprises multimedia, heart rate, temperature, pressure, velocity, or acceleration.

113. The apparatus of claim 102, wherein the at least one characteristic comprises an indication relating to multimedia, heart rate, temperature, pressure, velocity, or acceleration.

114. The apparatus of claim 102, wherein the receiver is adapted to receive processed data derived as a result of the processing by the device.

115. The apparatus of claim 114, wherein the processed data received from the device have been processed to improve at least one attribute of the at least one characteristic.

116. The apparatus of claim 115, wherein the at least one attribute comprises at least one of the group consisting of: frequency response, signal-to-noise ratio, and accuracy.

117. The apparatus of claim 114, wherein the processed data received from the device were subjected to equalization, echo cancellation or active noise cancellation.

118. The apparatus of claim 114, wherein, as compared to the analog data, the processed data received from the device have less degradation of the at least one characteristic.

119. The apparatus of claim 118 wherein the degradation relates to noise, interference, or noise and interference.

120. The apparatus of claim 114, wherein the processed data received from the device comprise waveform encoded data.

121. The apparatus of claim 114, further comprising a transducer that generates an output based on the processed data, wherein the processed data received from the device is directly passed to the transducer.

122. The apparatus of claim 102, wherein the preprocessed data are transmitted via a wireless personal area network air interface or a wireless body area network air interface.

123. The apparatus of claim 102, wherein the preprocessed data are transmitted via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

124. An apparatus for processing data, comprising:
means for transmitting a request to a device for information related to a capability of the device, wherein the transmitting means is further configured to transmit a processing offloading request to the device to perform a specified processing of analog data based on a response to the information request received from the device;
means for receiving a positive response or a negative response to the processing offloading request; and
means for preprocessing the analog data for wireless transmission in response to the positive response to the processing offloading request;
wherein said transmitting means is further adapted to transmit the preprocessed data to the device in response to the positive response to the processing offloading request, and further wherein the device is adapted to perform the specified processing of the preprocessed data to improve at least one characteristic represented by the analog data.

125. The apparatus of claim 124, wherein the means for preprocessing comprises means for waveform encoding the analog data for wireless transmission.

126. The apparatus of claim 124, wherein the means for preprocessing comprises means for sigma delta modulation encoding the analog data for wireless transmission.

127. The apparatus of claim 124, wherein the preprocessed data comprise data to be converted into pulse code modulated data.

128. The apparatus of claim 124, wherein the preprocessed data comprise data to be equalized, data to be subjected to echo cancellation, data to be subjected to active noise cancellation, data to be filtered and decimated, data to be subjected to filter tap computation, data to be subjected to side-tone processing, or data to be subjected to voice recognition processing.

129. The apparatus of claim 124, wherein the preprocessed data comprise data to be processed to determine heart rate, classify heart rate, determine temperature, determine pressure, determine velocity, or determine acceleration.

130. The apparatus of claim 124, wherein the means for preprocessing performs at least one of the group consisting of: error coding, scrambling, interleaving, and formatting.

131. The apparatus of claim 124, further comprising means for sensing, wherein the analog data comprise raw analog data output by the means for sensing.

132. The apparatus of claim 124, wherein the analog data comprise an analog waveform.

133. The apparatus of claim 124, further comprising a chemical transducer, an electrical transducer, a mechanical transducer, a magnetic transducer, a nuclear transducer, or an optical transducer, adapted generate the analog data.

134. The apparatus of claim 124, wherein the at least one characteristic comprises multimedia, heart rate, temperature, pressure, velocity, or acceleration.

135. The apparatus of claim 124, wherein the at least one characteristic comprises an indication relating to multimedia, heart rate, temperature, pressure, velocity, or acceleration.

136. The apparatus of claim 124, wherein said means for receiving is adapted to receive the processed data derived as a result of the processing by the device.

137. The apparatus of claim 136, wherein the processed data received from the device have been processed to improve at least one attribute of the at least one characteristic.

138. The apparatus of claim 137, wherein the at least one attribute comprises at least one of the group consisting of: frequency response, signal-to-noise ratio, and accuracy.

139. The apparatus of claim 136, wherein the processed data received from the device were subjected to equalization echo cancellation or active noise cancellation.

140. The apparatus of claim 136, wherein, as compared to the analog data, the processed data received from the device have less degradation of the at least one characteristic.

141. The apparatus of claim 140 wherein the degradation relates to noise, interference, or noise and interference.

142. The apparatus of claim 136, wherein the processed data received from the device comprise waveform encoded data.

143. The apparatus of claim 136, further comprising means for directly passing the processed data received from the device to a transducer that generates an output based on the processed data.

144. The apparatus of claim 124, wherein the preprocessed data are transmitted via a wireless personal area network air interface or a wireless body area network air interface.

145. The apparatus of claim 124, wherein the preprocessed data are transmitted via ultra-wideband pulses each of which has a fractional bandwidth on the order of 20% or more, has a bandwidth on the order of 500 MHz or more, or has a fractional bandwidth on the order of 20% or more and has a bandwidth on the order of 500 MHz or more.

146. A computer-program product for processing data, comprising:
a non-transitory computer-readable medium comprising codes executable by at least one computer to:
transmit, at a first device, a request to a second device for information related to a capability of the second device;
receive, at the first device, a response to the information request indicating the capability of the second device;
determine whether to send a processing offloading request to the second device based on the capability of the second device;
in response to determining to send the processing offloading request to the second device, perform the following:
transmit the processing offloading request to the second device to perform a specified processing of analog data;
receive, at the first device, a response to the processing offloading request; and
if the response indicates that the second device agrees to perform the processing of the analog data, preprocess the analog data at the first device for wireless transmission and transmit the preprocessed data to the second device that is adapted to perform the specified processing of the preprocessed data to improve at least one characteristic represented by the analog data.

147. A headset for processing data, comprising:
a transmitter adapted to:
transmit a request to a device for information related to a capability of the device; and
transmit a processing offloading request to the device to perform a specified processing of analog data based on a response to the information request received from the device;
a receiver adapted to receive a positive response or a negative response to the processing offloading request;
a processor adapted to preprocess the analog data for wireless transmission in response to the positive response to the processing offloading request;
wherein the transmitter is further adapted to transmit the preprocessed data to the device in response to the positive response to the processing offloading request, wherein the device is adapted to perform the specified processing of the preprocessed data to improve at least one characteristic represented by the analog data; and
a transducer adapted to provide an audible output based on the data processed by the device.

148. A watch for processing data, comprising:
a transmitter adapted to:
transmit a request to a device for information related to a capability of the device; and
transmit a processing offloading request to the device to perform a specified processing of analog data based on a response to the information request received from the device;
a receiver adapted to receive a positive response or a negative response to the processing offloading request;
a processor adapted to preprocess the analog data for wireless transmission in response to the positive response to the processing offloading request;
wherein the transmitter is further adapted to transmit the preprocessed data to the device in response to the positive response to the processing offloading request, wherein the device is adapted to perform the specified processing of the preprocessed data to improve at least one characteristic represented by the analog data; and
a display adapted to provide a visual output based on the data processed by the device.

149. A medical device for processing data, comprising:
a transmitter adapted to:
transmit a request to a device for information related to a capability of the device; and
transmit a processing offloading request to the device to perform a specified processing of analog data based on a response to the information request received from the device;
a receiver adapted to receive a positive response or a negative response to the processing offloading request;
a processor adapted to preprocess the analog data for wireless transmission in response to the positive response to the processing offloading request;
wherein the transmitter is further adapted to transmit the preprocessed data to the device in response to the positive response to the processing offloading request, wherein the device is adapted to perform the specified processing of the preprocessed data to improve at least one characteristic represented by the analog data; and
a sensor adapted to generate the analog data to be transmitted by the transmitter.

* * * * *